(12) United States Patent
Kubo

(10) Patent No.: US 10,260,258 B2
(45) Date of Patent: Apr. 16, 2019

(54) CAPACITIVE PROXIMITY SENSOR AND DOOR HANDLE DEVICE COMPRISING THE CAPACITIVE PROXIMITY SENSOR

(71) Applicant: Tokyo Parts Industrial Co., Ltd., Gunma-ken (JP)

(72) Inventor: Mamoru Kubo, Gunma-ken (JP)

(73) Assignee: Tokyo Parts Industrial Co., Ltd. (JP)

( * ) Notice: Subject to any disclaimer, the term of this patent is extended or adjusted under 35 U.S.C. 154(b) by 13 days.

(21) Appl. No.: 15/795,441

(22) Filed: Oct. 27, 2017

(65) Prior Publication Data

US 2018/0135339 A1 May 17, 2018

(30) Foreign Application Priority Data

Nov. 17, 2016 (JP) .................. 2016-223754

(51) Int. Cl.
*G01D 5/24* (2006.01)
*E05B 81/78* (2014.01)
(Continued)

(52) U.S. Cl.
CPC ............ *E05B 81/77* (2013.01); *E05B 81/78* (2013.01); *E05B 85/10* (2013.01); *G01D 5/24* (2013.01);
(Continued)

(58) Field of Classification Search
CPC .......... E05B 81/00; E05B 81/54; E05B 81/64; E05B 81/76; E05B 81/77; E05B 81/78; E05B 85/00; E05B 85/10; G01D 5/00; G01D 5/12; G01D 5/14; G01D 5/24; G01D 5/241; G01D 5/2412; G01D 5/2417; G01D 5/243; G01J 5/44; G07C 9/00; G06K 9/0002; G01R 27/26; G01R 27/2605; H03K 17/00; H03K 17/94; H03K 17/945;
(Continued)

(56) References Cited

U.S. PATENT DOCUMENTS

| 5,394,292 A * | 2/1995 | Hayashida ............ B60R 19/483 180/274 |
| 2011/0199251 A1* | 8/2011 | Iwata ...................... G01S 7/032 342/27 |

(Continued)

FOREIGN PATENT DOCUMENTS

| JP | 2002039708 A | 2/2002 |
| JP | 2002057564 A | 2/2002 |

*Primary Examiner* — Hoai-An D. Nguyen
(74) *Attorney, Agent, or Firm* — Jordan and Koda, PLLC

(57) ABSTRACT

In a state in which a high-frequency signal at a first detection frequency $f_1$ is input to an LCR resonance circuit 20, upon detecting that a voltage signal $S_1$ is greater than or equal to an upper-limit threshold value $V_{th11}$ or less than or equal to a first lower-limit threshold value $V_{th12}$, a high-frequency signal at a second detection frequency $f_2$ is input to the LCR resonance circuit 20. Then, in a state in which the high-frequency signal at the second detection frequency $f_2$ is input, the proximity of a human body or water to a sensor electrode 22 is detected by detecting that the voltage signal has reached less than or equal to a second lower-limit threshold value $V_{th21}$.

16 Claims, 12 Drawing Sheets

(51) Int. Cl.
*E05B 85/10* (2014.01)
*G07C 9/00* (2006.01)
*H03K 17/955* (2006.01)

(52) U.S. Cl.
CPC ............ *G07C 9/00* (2013.01); *H03K 17/955* (2013.01); *H03K 2217/96073* (2013.01)

(58) Field of Classification Search
CPC .......... H03K 17/955; H03K 2217/945; H03K 2217/956; H03K 2217/960705; H03K 2217/960725; H03K 2217/960755
USPC ....... 324/600, 629, 633, 649, 652, 658, 663, 324/667, 668, 674, 675, 681, 682, 686, 324/519, 548, 76.11, 76.39, 76.49, 76.51; 345/173, 174; 702/47, 52
See application file for complete search history.

(56) References Cited

U.S. PATENT DOCUMENTS

| | | | | |
|---|---|---|---|---|
| 2013/0187479 | A1* | 7/2013 | Tsuchiya ................ | H02J 7/025 307/109 |
| 2014/0362310 | A1* | 12/2014 | Nanbu .................... | G06F 3/044 349/12 |
| 2017/0350169 | A1* | 12/2017 | Kubo ...................... | E05B 81/77 |
| 2017/0351359 | A1* | 12/2017 | Lo ........................... | A63H 3/02 |
| 2018/0093695 | A1* | 4/2018 | Hattori .................... | G01B 7/14 |

\* cited by examiner

CAPACITIVE PROXIMITY SENSOR AND DOOR HANDLE DEVICE COMPRISING THE CAPACITIVE PROXIMITY SENSOR

BACKGROUND

1. Technical Field

The present invention relates to a capacitive proximity sensor installed, for example, in a doorhandle of a vehicle equipped with a keyless entry system or the like, which detects the proximity or contact of a human body (hand or the like), and to a doorhandle device comprising this capacitive proximity sensor.

2. Related Art

Recently, automobiles are equipped with keyless entry systems, which can lock and unlock doors without key operations. Keyless entry systems comprise: an authentication unit provided within the vehicle; a remote device carried by a user; a proximity sensor, provided on a doorhandle at the exterior of the vehicle, which detects contact when a user contacts a predetermined position on the doorhandle; a locking unit, which locks the door; and an unlocking unit, which unlocks the door.

Known proximity sensors include capacitive proximity sensors, which detect the proximity of an object based on changes in the capacitance of a sensor electrode.

Furthermore, in capacitive proximity sensors, it is known to use an LCR resonance circuit including a sensor electrode in order to ensure a large change in the output signal between proximity and non-proximity of an object and thus improve detection accuracy.

Japanese Patent Laid-Open Publication No. 2002-39708 describes a capacitive proximity sensor in which a series resonance circuit is formed, having a resonance frequency fr, in which a resonant capacitance is the capacitance of a resonance circuit, which includes the electrode capacitance of a sensor electrode, and this resonant capacitance and a resonant inductor are connected in series, this series resonance circuit being caused to resonate at an excitation frequency f0 that is higher than the resonance frequency fr, and an object is detected on the basis of the resonance voltage of this series resonance circuit.

With the capacitive proximity sensor described in Japanese Patent Laid-Open Publication No. 2002-39708, by setting the excitation frequency f0 higher than the resonance frequency fr, the resonance voltage will always decrease when an object approaches the sensor electrode, and therefore it is possible to detect the object from the change in the resonance voltage.

Furthermore, Japanese Patent Laid-Open Publication No. 2002-57564 discloses a human body detector, which detects only human bodies, distinguishing between human bodies and raindrops, based on changes in the output frequency, or the output within a predetermined time, when the output of a capacitive sensor is received.

However, with the capacitive proximity sensor described in Japanese Patent Laid-Open Publication No. 2002-39708, only the decrease in the resonance voltage, as compared to the state in which an object is not present in the proximity of the sensor electrode, is detected, and therefore it is essentially not possible to distinguish between different objects (for example, a human body and water).

Furthermore, the human body detector described in Japanese Patent Laid-Open Publication No. 2002-57564 is premised on the output changing more rapidly when contact is made by water than when contact is made by a human body, but due to changes in the environment such as temperature, and circuit constants for the detection circuit, it is difficult to distinguish between a human body and water.

It is well known that when a dielectric, such as a human body or water, approaches or contacts a sensor electrode, the capacitance of the sensor electrode increases. Study by the present inventors confirms that, for example, in cases in which, supposing a vehicle is being washed and a relatively large amount of water wets the doorhandle, the capacitance of the sensor electrode will be greater than capacitance of the sensor electrode when a human body has contacted the doorhandle. Accordingly, by choosing an excitation frequency lower than the resonance frequency of the resonance circuit, as opposed to that in Japanese Patent Laid-Open Publication No. 2002-39708, this can be set so that, starting from the state in which no object is in proximity, the resonance voltage will change in completely opposite directions, in the case in which a human body is in the proximity of the sensor electrode, and the case in which water is in the proximity of the sensor electrode, and thus it will be possible to distinguish between a human body and water.

However, if the excitation frequency is set to lower than the resonance frequency of the resonance circuit, when the sensor electrode is touched once with a finger, for example, the resonance voltage may change so as to straddle a predetermined threshold value, at the two points in time at which the finger approaches the sensor electrode and at which it moves away from the sensor electrode. In this case, detection will undesirably occur twice with one touch and, for example, in a doorhandle device comprising a capacitive proximity sensor, the door unlocking/locking operation, will be performed twice consecutively, which causes problems.

SUMMARY

One or more embodiments of the present invention provides a capacitive proximity sensor with which detection will not be performed twice with one touch, and a doorhandle device comprising this capacitive proximity sensor.

Furthermore, one or more embodiments of the present invention provides a capacitive proximity sensor with which detection will not be performed twice with one touch and further can reliably distinguish between a human body and water, and a doorhandle device comprising this capacitive proximity sensor.

Note that, in the aspects described below, the constituent elements employed can be used in the most freely chosen combinations possible. Furthermore, the aspects and technical features of the present invention are not limited to those described hereafter, and are to be understood based on the description in the entire specification and the drawings, or based on the inventive ideas that can be grasped by the skilled artisan based on these descriptions.

A first aspect of the present invention relating to a capacitive proximity sensor comprises:

an oscillation means, which outputs a high-frequency signal;

a sensor circuit, having an LCR resonance circuit including a sensor electrode, into which the high-frequency signal is input, and which outputs a voltage signal in accordance with the capacitance of the sensor electrode; and a control unit, which detects the proximity of a human body to the sensor electrode, based on the voltage signal, wherein the control unit:

in a detection preparation mode, detects a resonance frequency $f_0$ of the LCR resonance circuit when no object is in the proximity of the sensor electrode, and detects a voltage signal $V_0$ when the high-frequency signal at the resonance frequency $f_0$ is input to the LCR resonance circuit, sets a first detection frequency $f_1$ that is lower than the resonance frequency $f_0$ and a second detection frequency $f_2$ that is higher than the first detection frequency $f_1$ and, based on the voltage signal $V_0$, sets an upper-limit threshold value $V_{th1}$ and a lower-limit threshold value $V_{th2}$ that is lower than the upper-limit threshold value $V_{th1}$, and in a detection mode, detects the proximity of a human body to the sensor electrode by, in a state in which the high-frequency signal at the first detection frequency $f_1$ is input to the LCR resonance circuit, upon detecting that the voltage signal has reached greater than or equal to the upper-limit threshold value $V_{th1}$, inputting a high-frequency signal at the second detection frequency $f_2$ to the LCR resonance circuit and, in this state, detecting that the voltage signal has reached less than or equal to the lower-limit threshold value $V_{th2}$.

A second aspect of the present invention relating to a capacitive proximity sensor comprises:

an oscillation means, which outputs a high-frequency signal;

a sensor circuit, having an LCR resonance circuit including a sensor electrode, into which the high-frequency signal is input, and which outputs a voltage signal in accordance with the capacitance of the sensor electrode; and a control unit, which detects the proximity of a human body to the sensor electrode, based on the voltage signal, wherein the control unit:

in a detection preparation mode, detects a resonance frequency $f_0$ of the LCR resonance circuit when no object is in the proximity of the sensor electrode, and detects a voltage signal $V_0$ when the high-frequency signal at the resonance frequency $f_0$ is input to the LCR resonance circuit, sets a first detection frequency $f_1$ that is lower than the resonance frequency $f_0$ and a second detection frequency $f_2$ that is higher than the first detection frequency $f_1$ and, based on the voltage signal $V_0$, sets an upper-limit threshold value $V_{th11}$, a first lower-limit threshold value $V_{th12}$ that is lower than the upper-limit threshold value $V_{th11}$, and a second lower-limit threshold value $V_{th21}$, and in a detection mode, detects the proximity of a human body to the sensor electrode by, in a state in which the high-frequency signal at the first detection frequency $f_1$ is input to the LCR resonance circuit, upon detecting that the voltage signal has reached greater than or equal to the upper-limit threshold value $V_{th11}$, inputting a high-frequency signal at the second detection frequency $f_2$ to the LCR resonance circuit and, in this state, detecting that the voltage signal has reached less than or equal to the second lower-limit threshold value $V_{th21}$, and detects the proximity of water to the sensor electrode by, in a state in which the high-frequency signal at the first detection frequency $f_1$ is input to the LCR resonance circuit, upon detecting that the voltage signal has reached less than or equal to the first lower-limit threshold value $V_{th12}$, inputting a high-frequency signal at the second detection frequency $f_2$ to the LCR resonance circuit and, in this state, detecting that the voltage signal has reached less than or equal to the second lower-limit threshold value $V_{th21}$, A third aspect of the present invention relating to a doorhandle device comprises:

a doorhandle mounted to an outer panel of a vehicle door, and a capacitive proximity sensor, wherein the doorhandle has a space at the interior thereof, and the capacitive proximity sensor is disposed within the space; and the capacitive proximity sensor comprises:

an oscillation means, which outputs a high-frequency signal;

a sensor circuit, having an LCR resonance circuit including a sensor electrode, into which the high-frequency signal is input, and which outputs a voltage signal in accordance with the capacitance of the sensor electrode; and a control unit, which detects the proximity of a human body to the sensor electrode, based on the voltage signal, wherein the control unit:

in a detection preparation mode, detects a resonance frequency $f_0$ of the LCR resonance circuit when no object is in the proximity of the sensor electrode, and detects a voltage signal $V_0$ when the high-frequency signal at the resonance frequency $f_0$ is input to the LCR resonance circuit, sets a first detection frequency $f_1$ that is lower than the resonance frequency $f_0$ and a second detection frequency $f_2$ that is higher than the first detection frequency $f_1$ and, based on the voltage signal $V_0$, sets an upper-limit threshold value $V_{th1}$ and a lower-limit threshold value $V_{th2}$ that is lower than the upper-limit threshold value $V_{th1}$, and in a detection mode, detects the proximity of a human body to the sensor electrode by, in a state in which the high-frequency signal at the first detection frequency $f_1$ is input to the LCR resonance circuit, upon detecting that the voltage signal has reached greater than or equal to the upper-limit threshold value $V_{th1}$, inputting a high-frequency signal at the second detection frequency $f_2$ to the LCR resonance circuit and, in this state, detecting that the voltage signal has reached less than or equal to the lower-limit threshold value $V_{th2}$.

A fourth aspect of the present invention relating to a doorhandle device comprises:

a doorhandle mounted to an outer panel of a vehicle door, and a capacitive proximity sensor, wherein the doorhandle has a space at the interior thereof, and the capacitive proximity sensor is disposed within the space; and the capacitive proximity sensor comprises:

an oscillation means, which outputs a high-frequency signal;

a sensor circuit, having an LCR resonance circuit including a sensor electrode, into which the high-frequency signal is input, and which outputs a voltage signal in accordance with the capacitance of the sensor electrode; and a control unit, which detects the proximity of a human body to the sensor electrode, based on the voltage signal, wherein the control unit:

in a detection preparation mode, detects a resonance frequency $f_0$ of the LCR resonance circuit when no object is in the proximity of the sensor electrode, and detects a voltage signal $V_0$ when the high-frequency signal at the resonance frequency $f_0$ is input to the LCR resonance circuit, sets a first detection frequency $f_1$ that is lower than the resonance frequency $f_0$ and a second detection frequency $f_2$ that is higher than the first detection frequency $f_1$ and, based on the voltage signal $V_0$, sets an upper-limit threshold value $V_{th11}$, a first lower-limit threshold value $V_{th12}$ that is lower than the upper-limit threshold value $V_{th11}$, and a second lower-limit threshold value $V_{th21}$, and in a detection mode, detects the proximity of a human body to the sensor electrode by, in a state in which the high-frequency signal at the first detection frequency $f_1$ is input to the LCR resonance circuit, upon detecting that the voltage signal has reached greater than or equal to the upper-limit threshold value $V_{th11}$, inputting a high-frequency signal at the second detection frequency $f_2$ to the LCR resonance circuit and, in this state, detecting that the voltage signal has reached less than or equal to the second lower-limit threshold value $V_{th21}$, and detects the proximity of water to the sensor electrode by, in a state in which the high-frequency signal at the first detection frequency $f_1$ is input to the LCR resonance circuit, upon detecting that the voltage signal has reached less than or equal to the first lower-limit threshold value $V_{th12}$, inputting a high-frequency signal at the second detection frequency $f_2$ to the LCR resonance circuit and, in this state, detecting that the voltage signal has reached less than or equal to the second lower-limit threshold value $V_{th21}$.

DETAILED DESCRIPTION OF THE PREFERRED EMBODIMENTS

Hereafter, exemplary modes of embodiment of the present invention are described with reference to the drawings.

First Exemplary Mode of Embodiment

The capacitive proximity sensor according to the first exemplary mode of embodiment of the present invention can be used as a sensor for locking and unlocking the doors of a vehicle in a so-called keyless entry system. In this case, the sensor electrode is provided within a doorhandle, which serves as a manipulated member, and is disposed at a predetermined position so that approach/contact can be detected when a user approaches/contacts a predetermined face of the doorhandle.

Figure 1:
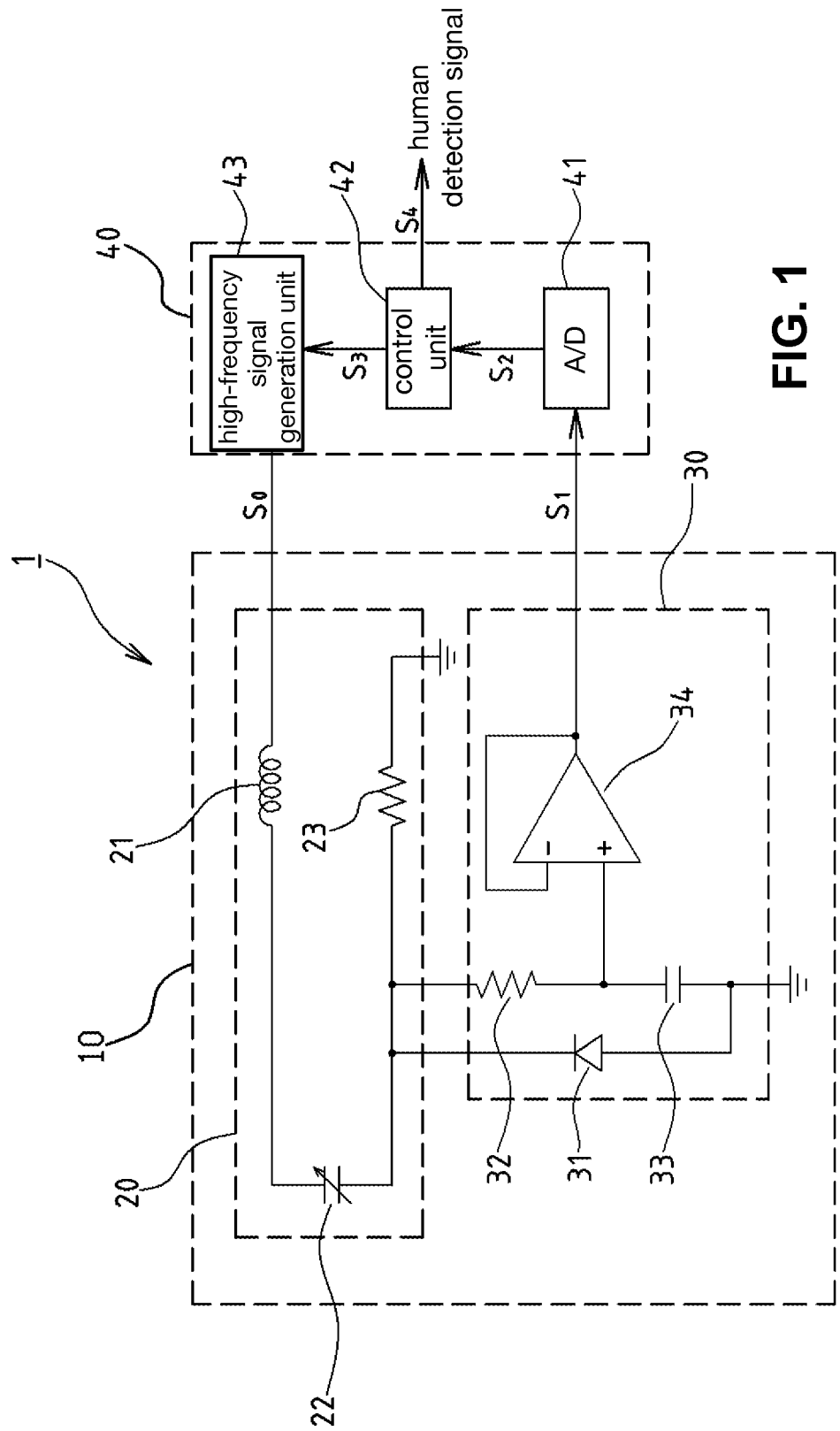
FIG. 1 is a block diagram showing the general configuration of a proximity sensor according to a first exemplary mode of embodiment of the present invention.

As shown in the block diagram in FIG. 1, the proximity sensor 1 in this example comprises primarily a sensor circuit 10 and a microcomputer 40, the sensor circuit 10 comprising an LCR resonance circuit 20 and a smoothing circuit 30.

The LCR resonance circuit 20 in this example is one in which an inductor (coil) 21, a sensor electrode (variable capacitance) 22, in which the capacitance increases when a dielectric such as a human body approaches or contacts it, and a fixed resistor 23 are connected in series. The capacitance of this sensor electrode 22 includes the capacitance between the sensor electrode 22 and the vehicle door main body, doorhandle or the like, and is increased by the proximity of a dielectric such as a human body or the like. Note that the LCR resonance circuit 20 is not limited to a series resonance circuit, and may also be a parallel resonance circuit.

The smoothing circuit 30 has a half-wave rectifying diode 31, a fixed resistor 32 and a capacitor 33, constituting a low-pass filter, and an output impedance converting buffer circuit 34. Note that, the smoothing circuit 30 can have any circuit configuration, so long as it outputs a voltage signal $S_1$ in accordance with the capacitance of the sensor electrode 22. Specifically, an inverting amplifier circuit, which inverts and amplifies the signal, may be added.

The microcomputer 40 has an A/D converter 41, a control unit 42 and a high-frequency signal generation unit 43. The A/D converter 41 performs A/D conversion of the voltage signal $S_1$ input from the smoothing circuit 30, and outputs this to the control unit 42 as a determination signal $S_2$. As described in detail below, the control unit 42 outputs a control signal $S_3$ to the high-frequency signal generation unit 43, in addition to which, if it has been determined that a human body has contacted the doorhandle (a human body is in the proximity of the sensor electrode 22) based on the determination signal $S_2$, the control unit 42 outputs a human detection signal $S_4$. As described in detail below, the high-frequency signal generation unit 43, which serves as an oscillator means, outputs a high-frequency signal $S_0$, having a predetermined frequency and a predetermined duty ratio, to the LCR resonance circuit 20, on the basis of the control signal $S_3$, input from the control unit 42.

In this example, a rectangular-wave high-frequency signal (approximately several hundred kHz) is used as the high-frequency signal $S_0$. Note that the high-frequency signal $S_0$ is not limited to rectangular waves, but rather sine waves, triangular waves and the like may be used.

The high-frequency signal $S_0$ that has been input to the LCR resonance circuit 20 is distorted by the inductor 21 and the sensor electrode (variable capacitance) 22 and becomes a waveform that is nearly a sawtooth wave, in which the rising edge and the trailing edge are delayed, which undergoes half-wave rectification by the diode 31. Then, when input to the smoothing circuit 30, it is smoothed by the fixed resistor 32 and the capacitor 33, which constitute the low-pass filter, and a voltage signal $S_1$ that is close to direct current is output.

Figure 2:
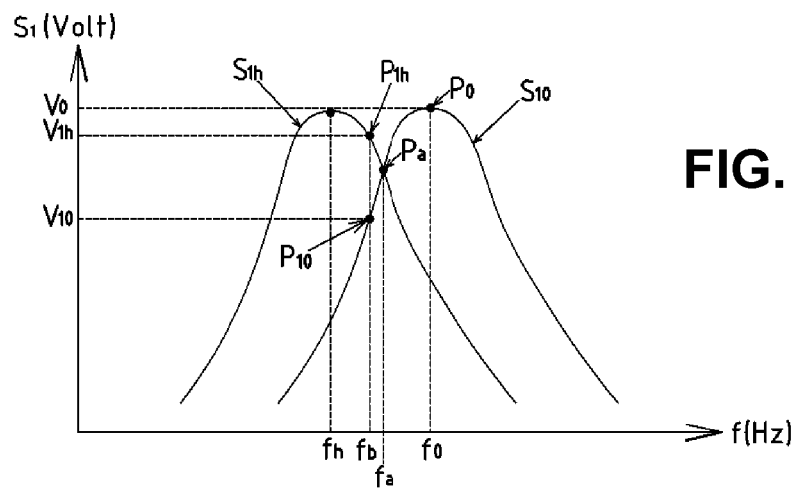
FIG. 2 is a graph showing the relationship between the frequency f of the high-frequency signal $S_0$ and the voltage signal $S_1$ when a human body is not in the proximity of the sensor electrode and when a human body is in the proximity of the sensor electrode.

FIG. 2 shows the relationship between the frequency f of the high-frequency signal $S_0$ that is input to the LCR resonance circuit 20 and the voltage signal $S_1$ when a human body (finger, hand or the like) is not in the proximity of the sensor electrode 22 and when this is in the proximity of the sensor electrode 22. Note that the voltage signal $S_{10}$ represents the situation when a human body is not in the proximity of the sensor electrode 22, and the voltage signal $S_{1h}$ represents the situation when a human body is in the proximity of the sensor electrode 22.

As shown in FIG. 2, the resonance frequency $f_h$ when a human body is in the proximity of the sensor electrode 22 is lower than the resonance frequency $f_0$ when a human body is not in the proximity of the sensor electrode 22. This is because the capacitance of the sensor electrode 22 increases when a human body approaches/contacts the doorhandle.

Here, if the frequency at the point $P_a$ where the graph of the voltage signal $S_{10}$ and the graph of the voltage signal $S_{1h}$ intersect is $f_a$, by controlling the frequency $f_b$ of the high-frequency signal $S_0$ input to the LCR resonance circuit 20 so as to satisfy the relationship $$f_b < f_a$$

the proximity of a human body to the sensor electrode 22 can be detected.

That is to say, by setting the frequency $f_b$ of the high-frequency signal $S_0$ input to the LCR resonance circuit 20 as described above, the voltage signal $V_{10}$ (voltage at point $P_{10}$) when a human body is not in the proximity of the sensor electrode 22 and the voltage signal $V_{1h}$ (voltage at point $P_{1h}$) when a human body is in the proximity of the sensor electrode 22 have the relationship $$V_{10} < V_{1h}.$$

In other words, when a human body is in the proximity of the sensor electrode 22, the voltage signal always increases, and thus the proximity of a human body to the sensor electrode 22 can be detected.

Meanwhile, for example, when the sensor electrode is touched once with a finger, the voltage signal changes in opposite manners when the finger approaches the sensor electrode and when the finger moves away from the sensor electrode. For this reason, it may happen that detection occurs twice with one touch. This point will be explained with reference to FIG. 3 and FIG. 4.

Figure 3:
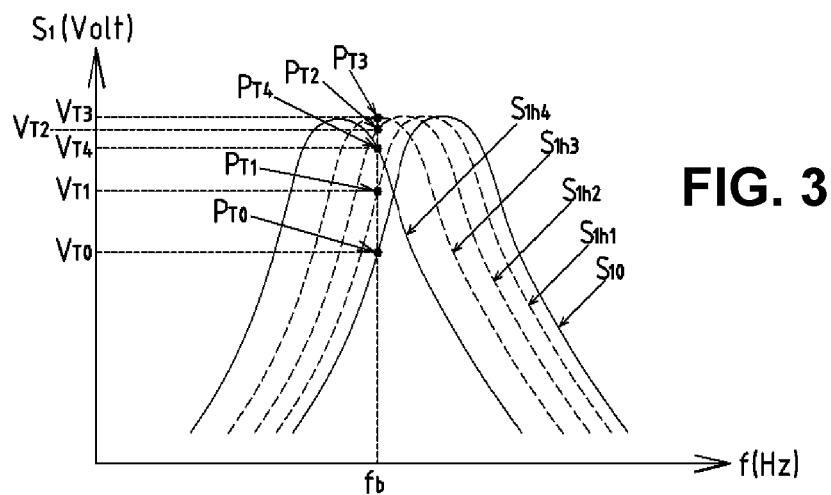
FIG. 3 is a graph showing the change over time in the frequency characteristics of the voltage signal $S_1$ starting from a state in which a finger is not in the proximity of the sensor electrode and up to a point in time at which it has approached and touched the sensor electrode.

FIG. 3 is an example of the change over time in the frequency characteristics of the voltage signal $S_1$ from a state in which the finger is not in the proximity of the sensor electrode 22 up to a point in time at which the finger approaches and touches the sensor electrode 22.

In FIG. 3, $S_{10}$ indicates the frequency characteristics of the voltage signal $S_1$ when a finger is not in the proximity of the sensor electrode 22, $S_{1h1}$ to $S_{1h3}$ indicate frequency characteristics of the voltage signal $S_1$ after times $T_1$ to $T_3$ from a finger starting to approach the sensor electrode 22, and $S_{1h4}$ indicates the frequency characteristics of the voltage signal $S_1$ when the finger has been brought into contact with the sensor electrode 22 after a time $T_4$ from a finger starting to approach the sensor electrode 22.

As shown in FIG. 3, when the high-frequency signal at the frequency $f_b$ mentioned above is input to the LCR resonance circuit 20, the voltage signal when the finger is not in the proximity of the sensor electrode 22 is $V_{T0}$ (voltage at point $P_{T0}$) and, starting from a finger starting to approach the sensor electrode 22: the voltage signal reaches $V_{T1}$ (voltage at point $P_{T1}$) after the time $T_1$; the voltage signal reaches $V_{T2}$ (voltage at point $P_{T2}$) after the time $T_2$; the voltage signal reaches $V_{T3}$ (voltage at point $P_{T3}$) after the time $T_3$; and the voltage signal reaches $V_{T4}$ (voltage at point $P_{T4}$) when the finger has been brought into contact with the sensor electrode 22 at the time $T_4$.

Figure 4:
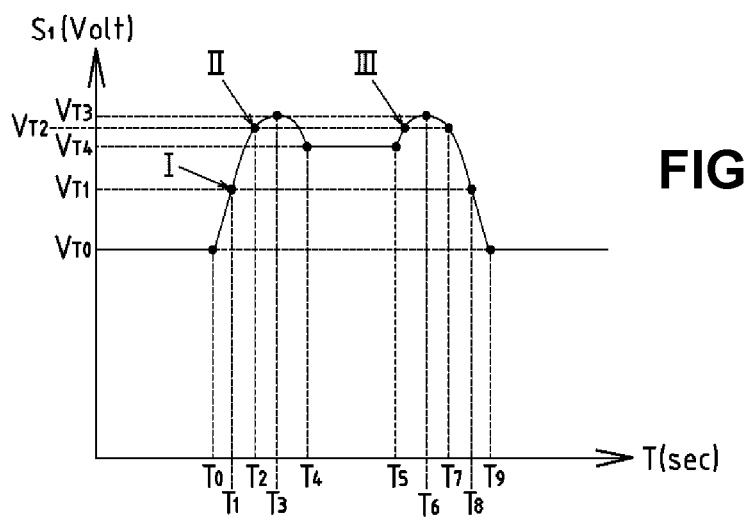
FIG. 4 is a graph showing the change over time in the voltage signal $S_1$ when the finger has approached and touched the sensor electrode.

FIG. 4 shows the change over time in the voltage signal $S_1$ when a finger approaches and touches the sensor electrode 22, in the state in which the high-frequency signal at the frequency $f_h$ mentioned above is input to the LCR resonance circuit 20 as described above. Note that FIG. 4 also shows the change over time in the voltage signal $S_1$ up to the state in which, after touching the sensor electrode 22 with the finger, the finger is completely removed.

As shown in FIG. 4, the voltage signal $S_1$ rises gradually after a finger starts to approach the sensor electrode 22, reaches the maximum value $V_{T3}$ after the time $T_3$, and then decreases and becomes $V_{T4}$ after the time $T_4$. While the sensor electrode 22 is being touched (time $T_4$ to $T_5$), the voltage signal remains substantially constant at $V_{T4}$. Upon starting to remove the finger from the sensor electrode 22, the voltage signal changes in a manner opposite to the process of the finger approaching (times $T_5$ to $T_9$).

Here, if the upper-limit threshold value $V_{th}$ for detecting proximity of a human body is set within the range of $$V_{T0} < V_{th} < V_{T4}$$

for example, at $V_{T1}$, it is possible to perform detection only once (point I in FIG. 4) with one touch. However, setting the upper-limit threshold value $V_{th}$ to a lower level makes it difficult to discriminate between a human body and, for example, water or the like, and there is a problem that erroneous detection tends to occur depending on the degree of ambient temperature change and variation in the characteristics of the sensor circuit components.

Meanwhile, if the upper-limit threshold value $V_{th}$ for detecting the proximity of a human body is within the range of $$V_{T4} < V_{th} < V_{T3}$$

for example, at $V_{T2}$, it is easy to distinguish a human body from water or the like, but there is a problem in that detection will disadvantageously be performed twice (at point II and point III in FIG. 4) with one touch.

Thus, in this example, instead of performing detection using only one frequency, detection is performed using two frequencies: the first detection frequency $f_1$ that is lower than the resonance frequency $f_0$ of the LCR resonance circuit 20 when no object is in the proximity of the sensor electrode 22; and the second detection frequency $f_2$ which is higher than this. Furthermore, the upper-limit threshold value $V_{th1}$ associated with the first detection frequency $f_1$ and the lower-limit threshold value $V_{th2}$ associated with the second detection frequency $f_2$ are set based on the voltage signal $V_0$ at the resonance frequency $f_0$ when no object is in the proximity of the sensor electrode 22.

Figure 5:
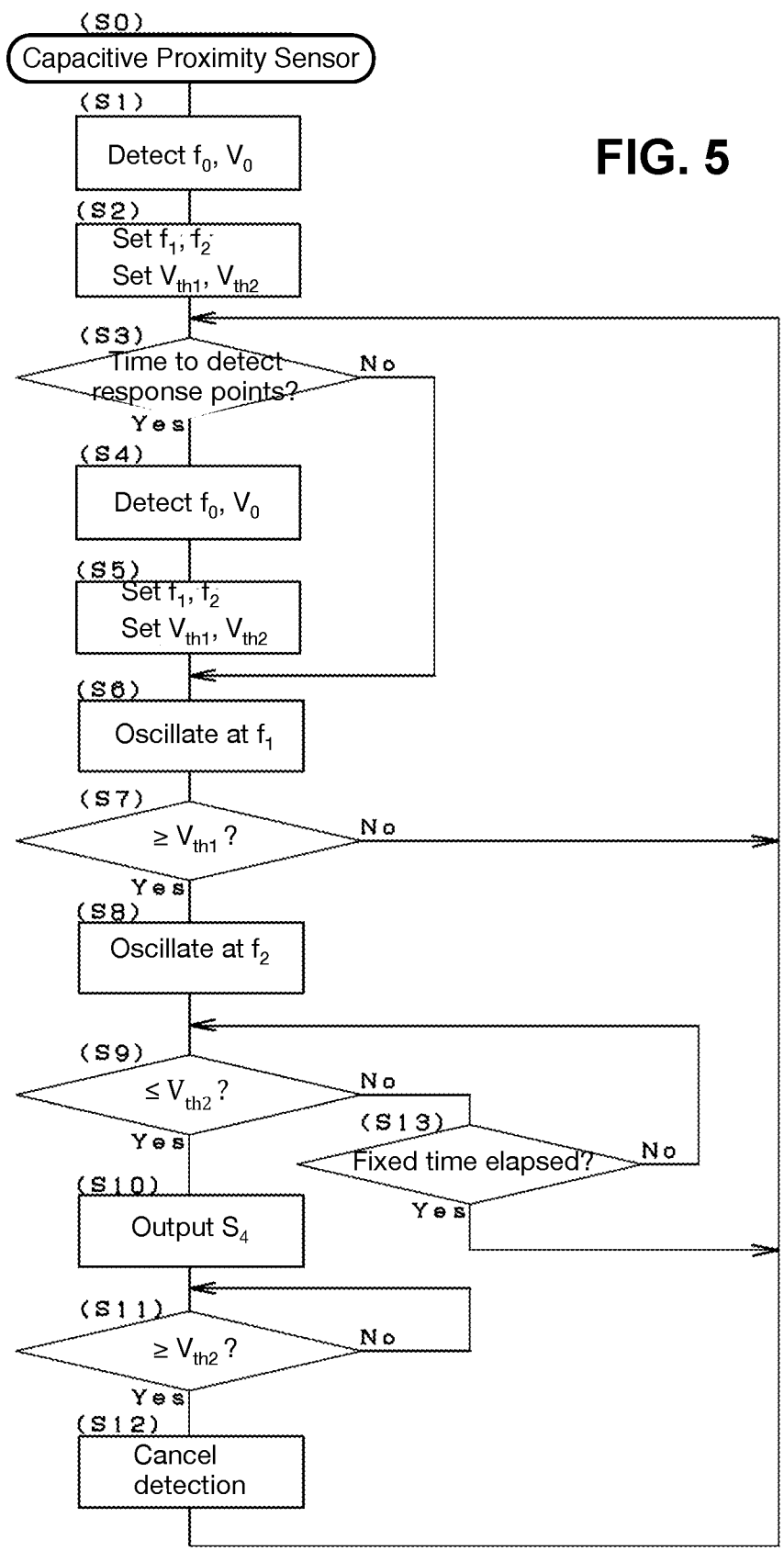
FIG. 5 is a flowchart serving to describe the detection processing performed in the proximity sensor according to the first exemplary mode of embodiment of the present invention.

Hereafter, human body detection operations with the proximity sensor 1 of this example will be described in detail using the flowchart in FIG. 5. Note that, in FIG. 5, steps S0 to S5 are in a detection preparation mode period, which serves to set the first detection frequency $f_1$, the second detection frequency $f_2$, the upper-limit threshold value $V_{th1}$ and the lower-limit threshold value $V_{th2}$, and steps S6 to S13 are in the detection mode period, in which the proximity of a human body to the sensor electrode 22 is detected.

Step S0

First, if a user carrying an electronic key approaches the vehicle, wireless communication is performed between the authentication system installed in the vehicle and the electronic key, and this is authenticated as being an authorized electronic key for the vehicle. Note that, this authentication can be performed by known authentication methods for smart entry systems. Once this has been authenticated as being an authorized electronic key, detection of a human body is performed by the proximity sensor 1.

Step S1

At the point in time at which the authorized electronic key has been authenticated, the situation is one in which no object is yet in the proximity of the sensor electrode 22, and the control unit 42 performs control so as to sweep the frequency of the high-frequency signal $S_0$ that is input to the LCR resonance circuit 20 from the high-frequency signal generation unit 43. In this example, this frequency sweep is performed at a specified sweep rate, from a start frequency of 230 kHz to a stop frequency of 274 kHz.

By performing the frequency sweep described above, the voltage signal $S_{10}$ shown in FIG. 2 is obtained, and the resonance frequency $f_0$ of the LCR resonance circuit 20 when no object is in the proximity of the sensor electrode 22 and the voltage signal $V_0$ (voltage at point $P_0$) when the high-frequency signal at the resonance frequency $f_0$ is input to the LCR resonance circuit 20 are detected.

Note that, in the proximity sensor 1 in this example, the resonance frequency $f_0$ is 261 kHz, the voltage signal $V_0$ is 2.72 V.

Step S2

Figure 6:
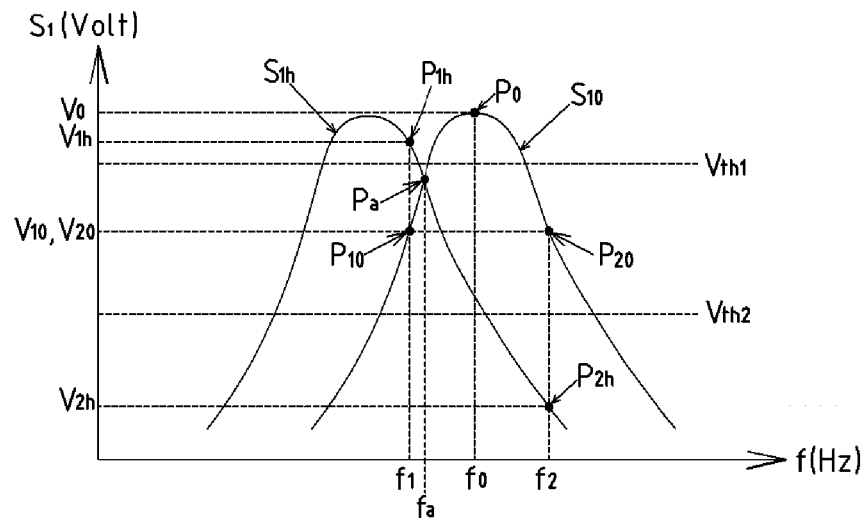
FIG. 6 is a graph serving to describe the first detection frequency $f_1$, the second detection frequency $f_2$, the upper-limit threshold value $V_{th1}$ and the lower-limit threshold value $V_{th2}$ in the first exemplary mode of embodiment of the present invention.

Next, as shown in FIG. 6, the control unit 42 sets the first detection frequency $f_1$ that is lower than the resonance frequency $f_0$ and a second detection frequency $f_2$ that is higher than the first detection frequency $f_1$, and sets the upper-limit threshold value $V_{th1}$ and the lower-limit threshold value $V_{th2}$ based on the voltage signal $V_0$.

In this example, the first detection frequency $f_1$ is set to 255 kHz, which is 6 kHz lower than the resonance frequency $f_0$, and the second detection frequency $f_2$ is set to 267 kHz, which is 6 kHz higher than the resonance frequency $f_0$.

The resonance frequency $f_h$ of the LCR resonance circuit 20 when a human body is in the proximity of the sensor electrode 22 is 253 kHz, and thus the first detection frequency $f_1$ is set higher than $f_h$. Furthermore, the frequency $f_a$ at the point $P_a$, which is the point at which the graph of the voltage signal $S_{10}$ when a human body is not in the proximity of the sensor electrode 22 and the graph of the voltage signal $S_{1h}$ when a human body is in the proximity intersect, is 259 Hz, and thus the first detection frequency $f_1$ is set to lower than $f_a$.

Furthermore, in this example, the upper-limit threshold value $V_{th1}$ was set to 2.19 V. The upper-limit threshold value $V_{th1}$ is a value resulting from adding 12% of the voltage signal $V_0$ (voltage at point $P_0$) to the voltage signal $V_{10}$ (voltage at point $P_{10}$) when the high-frequency signal at the first detection frequency $f_1$ is input to the LCR resonance circuit 20, in the state in which no object is in the proximity of the sensor electrode 22.

Note that, when a high-frequency signal at the first detection frequency $f_1$ is input to the LCR resonance circuit 20, if the voltage signal when a human body is in the proximity of the sensor electrode 22 is $V_{1h}$ (voltage at point $P_{1h}$), the relationship $$V_{10} < V_{th1} < V_{1h}$$

is satisfied (see FIG. 6).

Furthermore, in this example, the lower-limit threshold value $V_{th2}$ is set to 1.63 V. The lower-limit threshold value $V_{th2}$ is set to a value of 60% of the voltage signal $V_0$ (voltage at point $P_0$).

Note that, when the high-frequency signal at the second detection frequency $f_2$ is input to the LCR resonance circuit 20, if the voltage signal when no object is in the proximity of the sensor electrode 22 is $V_{2O}$ (voltage at point $P_{2O}$), and the voltage signal when a human body is in the proximity of the sensor electrode 20 is $V_{2h}$ (voltage at point $P_{2h}$), the relationship $$V_{2h} < V_{th2} < V_{2O}$$

is satisfied (see FIG. 6).

Step S3→Step S5

In order to refresh the first detection frequency $f_1$, the second detection frequency $f_2$, the upper-limit threshold value $V_{th1}$ and the lower-limit threshold value $V_{th2}$ at predetermined time intervals, the resonance frequency $f_0$ of the LCR resonance circuit 20 and the voltage signal $V_0$, when no object is in the proximity of the sensor electrode 22, are detected at predetermined time intervals. For this purpose, in step S3, a determination is made as to whether or not it is time to detect the resonance frequency $f_0$ and the voltage signal $V_0$ (which is to say, time to detect the resonance points).

More specifically, if one minute or more has elapsed since the previous detection, after performing the same detection and settings as in steps S1 to S2 in steps S4 to S5, we proceed to step S6. Furthermore, if one minute or more has not elapsed since the previous detection, we proceed directly to step S6.

Step S6

The control unit 42 performs control so as to input the high-frequency signal $S_0$ at the first detection frequency $f_1$ to the LCR resonance circuit 20, from the high-frequency signal generation unit 43.

Step S7→Step S8

Figure 7:
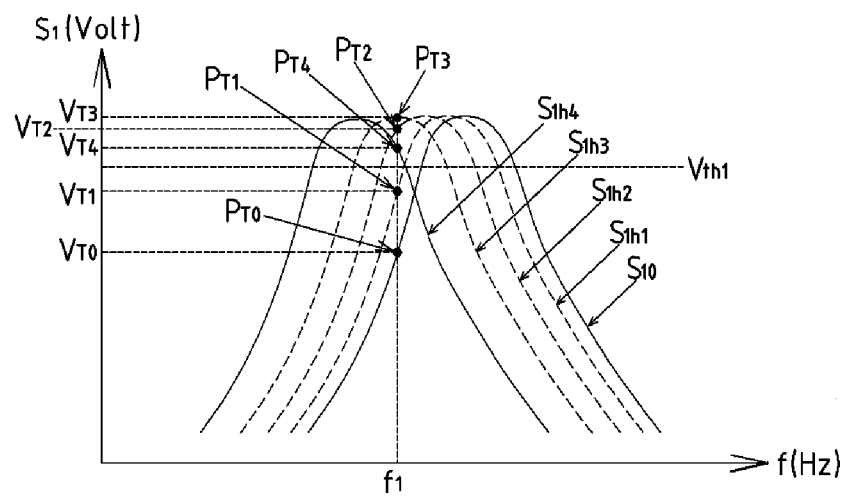
FIG. 7 is a graph showing changes in the voltage signal $S_1$ when a person approaches/contacts the sensor electrode, in a state in which the high-frequency signal $S_0$ at the first detection frequency $f_1$ is input, in the first exemplary mode of embodiment of the present invention.

When the high-frequency signal $S_0$ at the first detection frequency $f_1$ is input to the LCR resonance circuit 20, if a human body is approaching the sensor electrode 22 from time $T_0$ to $T_4$, as shown in FIG. 7, the graph of the voltage signal $S_1$ also changes in the manner of $S_{10} \to S_{1h1} \to S_{1h2} \to S_{1h3} \to S_{1h4}$, and therefore the voltage signal $S_1$ changes in the manner of $V_{T0}$ (voltage at point $P_{T0}$)→$V_{T1}$ (voltage at point $P_{T1}$)→$V_{T2}$ (voltage at point $P_{T2}$)→$V_{T3}$ (voltage at point $P_{T3}$)→$V_{T4}$ (voltage at point $P_{T4}$).

In the process in which the voltage signal $S_1$ changes in the manner described above, when the voltage signal $S_1$ has reached greater than or equal to the upper-limit threshold value $V_{th1}$, it is possible that a human body is in the proximity of the sensor electrode 22, and thus the control unit 42 switches the signal $S_0$ from the first detection frequency $f_1$ to the second detection frequency $f_2$.

In the case of FIG. 7, $$V_{T1} < V_{th1} < V_{T2}$$

and therefore it switches from the first detection frequency $f_1$ to the second detection frequency $f_2$ between the time $T_1$ and the time $T_2$.

Step S9, Step S10, Step S13

When the high-frequency signal $S_0$ of the second detection frequency $f_2$ is input to the LCR resonance circuit 20, if a human body is approaching the sensor electrode 22 from the time $T_0$ to $T_4$ as described above, as shown in FIG. 8, the graph of voltage signal $S_1$ also changes in the manner of $S_{10} \to S_{1h1} \to S_{1h2} \to S_{1h3} \to S_{1h4}$ and therefore the voltage signal $S_1$ changes in the manner of $V_{T0}$ (voltage at point $P_{T0}$)→$V_{T1}$ (voltage at point $P_{T1}$)→$V_{T2}$ (voltage at point $P_{T2}$)→$V_{T3}$ (voltage at point $P_{T3}$)→$V_{T4}$ (voltage at point $P_{T4}$).

Figure 8:
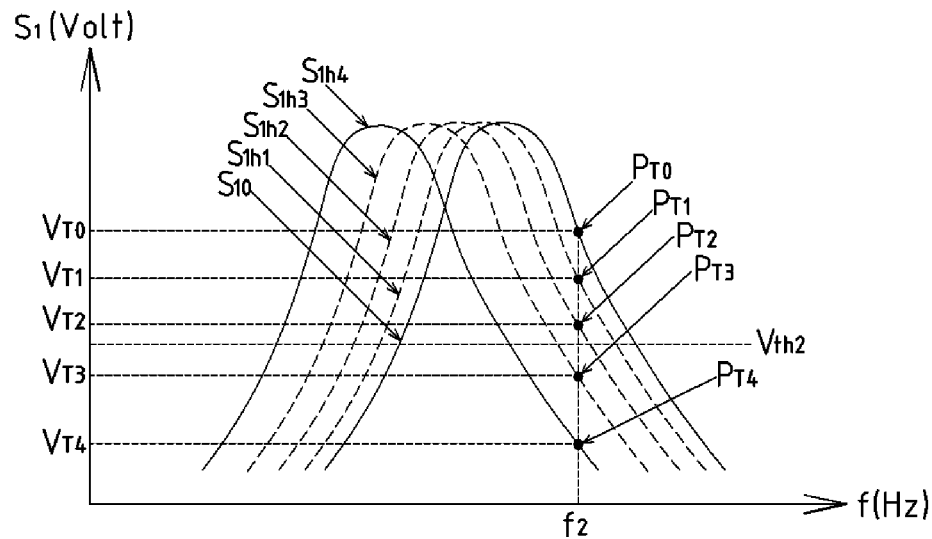
FIG. 8 is a graph showing changes in the voltage signal $S_1$ when a person approaches/contacts the sensor electrode, in a state in which the high-frequency signal $S_0$ at the second detection frequency $f_2$ is input, in the first exemplary mode of embodiment of the present invention.

In the case of FIG. 8, $$V_{T2} > V_{th2} > V_{T3}$$

and therefore it is determined that a human body has made contact with the doorhandle (a human body is in the proximity of the sensor electrode 22) between the time $T_2$ and the time $T_3$, and thus the human detection signal $S_4$ is output.

Note that, if the voltage signal $S_1$ does not reach less than or equal to the lower-limit threshold value $V_{th2}$ even after a predetermined time (1 second in this example) has elapsed since switching to the second detection frequency $f_2$, the situation is treated as effect of transitory noise, or no intention to unlock, and we return to the detection preparation mode.

Step S11→Step S12

Figure 9:
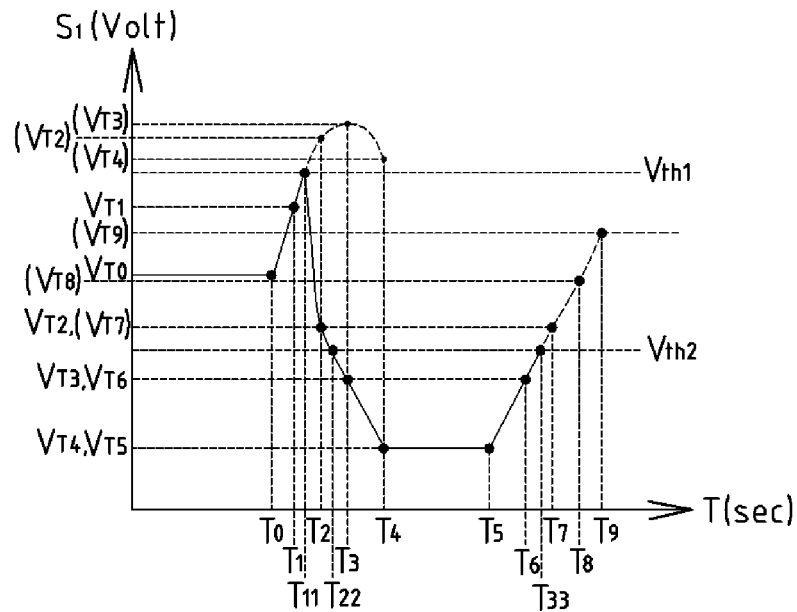
FIG. 9 is a graph showing the change over time in the voltage signal $S_1$ after a finger has approached and touched the sensor electrode and up to the point in time at which the finger has been completely removed, in the first exemplary mode of embodiment of the present invention.

Graphing the change over time in the voltage signal $S_1$ after the finger has gradually approached and touched the sensor electrode 22 as described above and up to the point in time at which the finger is completely removed results in the graph shown in FIG. 9.

Based on the first detection frequency $f_1$, the voltage signal $S_1$ gradually starts to rise from the time $T_0$ and reaches greater than or equal to the upper-limit threshold value $V_{th1}$ at the time $T_{11}$. Upon switching from the first detection frequency $f_1$ to the second detection frequency $f_2$ at the time $T_{11}$, the voltage signal $S_1$ reaches less than or equal to the lower-limit threshold value $V_{th2}$ at the time $T_{22}$, which is before the touch ends, and thus the human detection signal $S_4$ is output. The voltage signal $S_1$ subsequently decreases and then substantially does not change while there is a complete touch (time $T_4$ to $T_5$). When the finger starts to be removed, the voltage signal $S_1$ rises in an opposite process, and is constant after the finger has been completely removed at the time $T_9$.

Thus, in this example, even after the human detection signal $S_4$ is output in step S10, detection continues based on the second detection frequency $f_2$, and when it is detected that the voltage signal $S_1$ has reached greater than or equal to the lower-limit threshold value $V_{th2}$ (time $T_{33}$), the series of detection operations are canceled, and we return to the detection preparation mode.

As described above, in the capacitive proximity sensor 1 of the present example, the resonance frequency $f_0$ of the LCR resonance circuit 20 when no object is in the proximity of the sensor electrode 22 and the voltage signal $V_0$ are detected in the detection preparation mode, the first detection frequency $f_1$ that is lower than the resonance frequency $f_0$, the second detection frequency $f_2$ that is higher than the resonance frequency $f_0$, the upper-limit threshold value $V_{th1}$ and the lower-limit threshold value $V_{th2}$ are set.

Then, in the detection mode, in the state in which the high-frequency signal at the first detection frequency $f_1$ is input to the LCR resonance circuit 20, upon detecting that the voltage signal $S_1$ has reached greater than or equal to the upper-limit threshold value $V_{th1}$, the high-frequency signal at the second detection frequency $f_2$ is input to the LCR resonance circuit 20. Furthermore, in the state in which the high-frequency signal at the second detection frequency $f_2$ is input, the proximity of a human body to the sensor electrode 22 is detected by detecting that the voltage signal $S_1$ has reached less than or equal to the lower-limit threshold value $V_{th2}$.

As a result, even if the upper-limit threshold value $V_{th1}$ is set high in order to limit the influence of changes in the ambient temperature and variations in characteristics of sensor circuit components, the proximity of a human body can be more reliably detected, without detection being performed twice with one touch. In addition, since the proximity of a human body can be detected only at point II, and not at point III, shown in FIG. 4, even if the touching state is prolonged, it will have been possible to quickly detect the proximity of a human body immediately before touching.

Furthermore, in this example, the first detection frequency $f_1$ is set higher than the resonance frequency $f_h$ of the LCR resonance circuit 20 when a human body is in the proximity of the sensor electrode 22. In this case, although the risk of detection being performed twice with one touch is increased, by performing detection using the first detection frequency $f_1$ and the second detection frequency $f_2$, which are different from each other, as described above, such risks can be avoided.

Furthermore, in this example, when the high-frequency signal at the first detection frequency $f_1$ is input to the LCR resonance circuit 20, the voltage signal $V_{10}$ when no object is in the proximity of the sensor electrode 22 and the voltage signal $V_{1h}$ when a human body is in the proximity of the sensor electrode 22 satisfy the relationship $$V_{10} < V_{th1} < V_{1h}$$

whereby proximity of a human body can be reliably detected.

Furthermore, in this example, by setting the second detection frequency $f_2$ at greater than or equal to the resonance frequency $f_0$ of the LCR resonance circuit 20 when no object is in the proximity of the sensor electrode 22, the degree of freedom with which the lower-limit threshold value $V_{th2}$ can be set is increased, such that it is possible to more reliably limit the influence of changes in ambient temperature and variations in the characteristics of sensor circuit components and thus more reliably detect the proximity of a human body to the sensor electrode.

Furthermore, in this example, when the high-frequency signal at the second detection frequency $f_2$ is input to the LCR resonance circuit 20, the voltage signal $V_{20}$ when no object is in the proximity of the sensor electrode 22 and the voltage signal $V_{2h}$ when a human body is in the proximity of the sensor electrode 22 satisfy the relationship $$V_{2h} < V_{th2} < V_{20}$$

whereby detection failure when a human body is in the proximity can be limited, allowing for more reliable detection.

Second Exemplary Mode of Embodiment

The first exemplary mode of embodiment relates only to the detection of a human body, but the proximity sensor of the second exemplary mode of embodiment is different from the first exemplary mode of embodiment in that it distinguishes between a human body and water.

Figure 10:
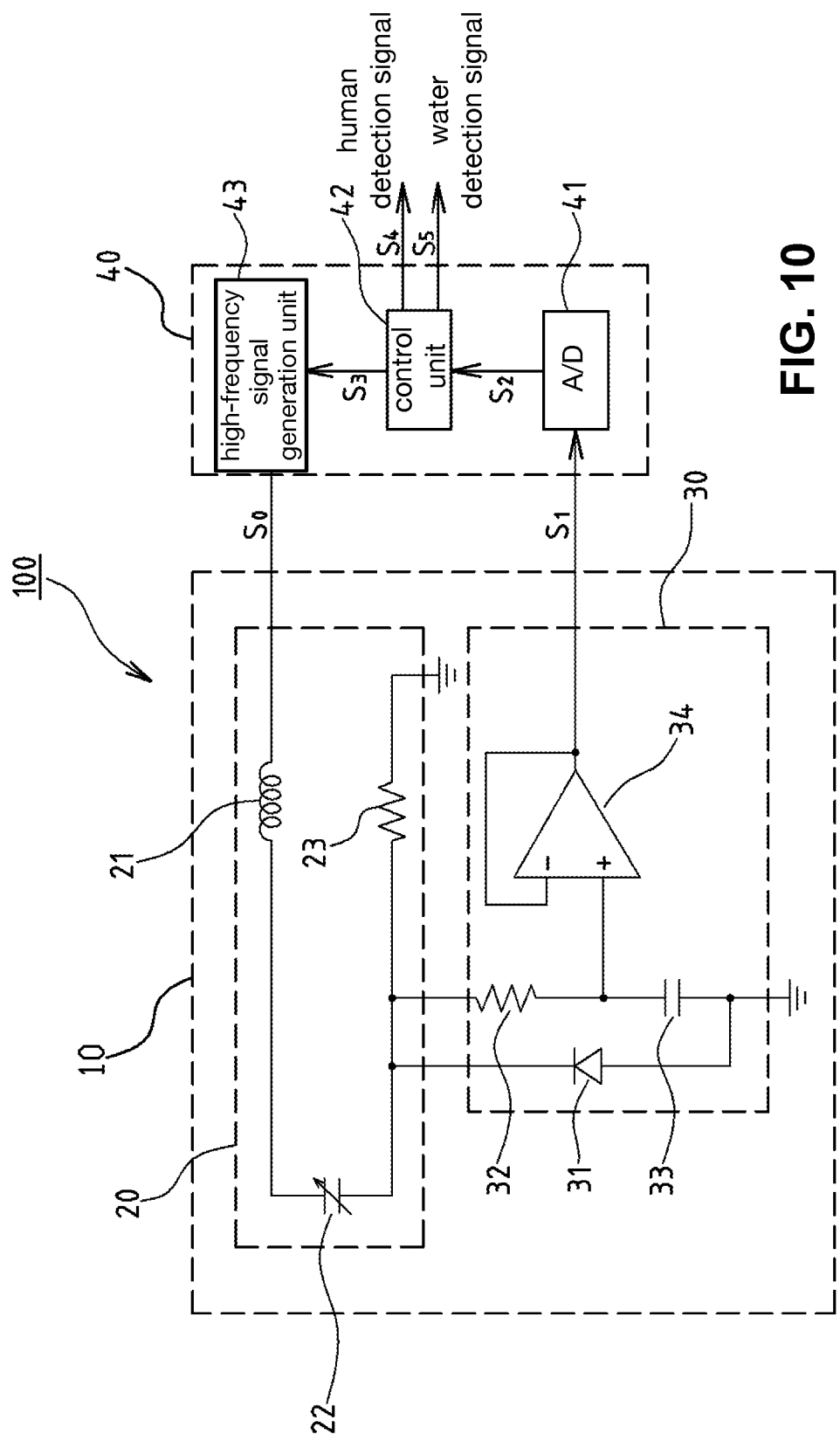
FIG. 10 is a block diagram showing the general configuration of a proximity sensor according to a second exemplary mode of embodiment of the present invention.

In the proximity sensor 100 of this example, there is an addition, in so much as, when the control unit 42 has determined that water has made contact with the doorhandle (water is in the proximity of the sensor electrode 22), a water detection signal $S_5$ is output, as shown in the block diagram in FIG. 10.

Figure 11:
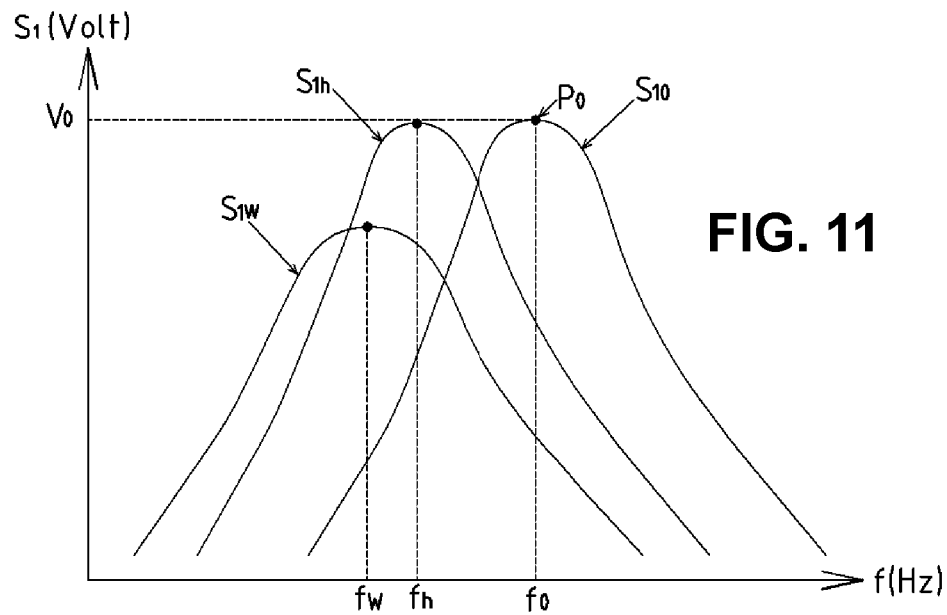
FIG. 11 is a graph showing the relationship between the frequency f of the high-frequency signal $S_0$ and the voltage signal $S_1$ when no object is in the proximity of the sensor electrode, when a human body is in the proximity of the sensor electrode, and when water is in the proximity of the sensor electrode.

FIG. 11 shows the relationship between the frequency f of the high-frequency signal $S_0$ that is input to the LCR resonance circuit 20 and the voltage signal $S_1$, when no object is in the proximity of the sensor electrode 22, when a human body is in the proximity, and when water is in the proximity. Note that the voltage signal $S_{10}$ indicates that no object is in the proximity of the sensor electrode 22, the voltage signal $S_{1h}$ indicates that a human body is in the proximity of the sensor electrode 22, and the voltage signal $S_{1W}$ indicates that water is in the proximity of the sensor electrode 22.

As shown in FIG. 11, if the resonance frequency when no object is in the proximity of the sensor electrode 22 is $f_0$, the resonance frequency when a human body (hand) is in the proximity of the sensor electrode 22 is $f_h$, and the resonance frequency when water is in the proximity of the sensor electrode 22 is $f_w$, the relationship $$f_w < f_h < f_0$$

is satisfied.

This is because, if a dielectric such as a human body contacts the doorhandle, the capacitance of the sensor electrode 22 will increase, and in cases in which, supposing the vehicle is being washed, a relatively large amount of water wets the doorhandle, the capacitance of the sensor electrode 22 will be greater than the capacitance of the sensor electrode 22 when a human body has come into contact with the doorhandle.

Figure 12:
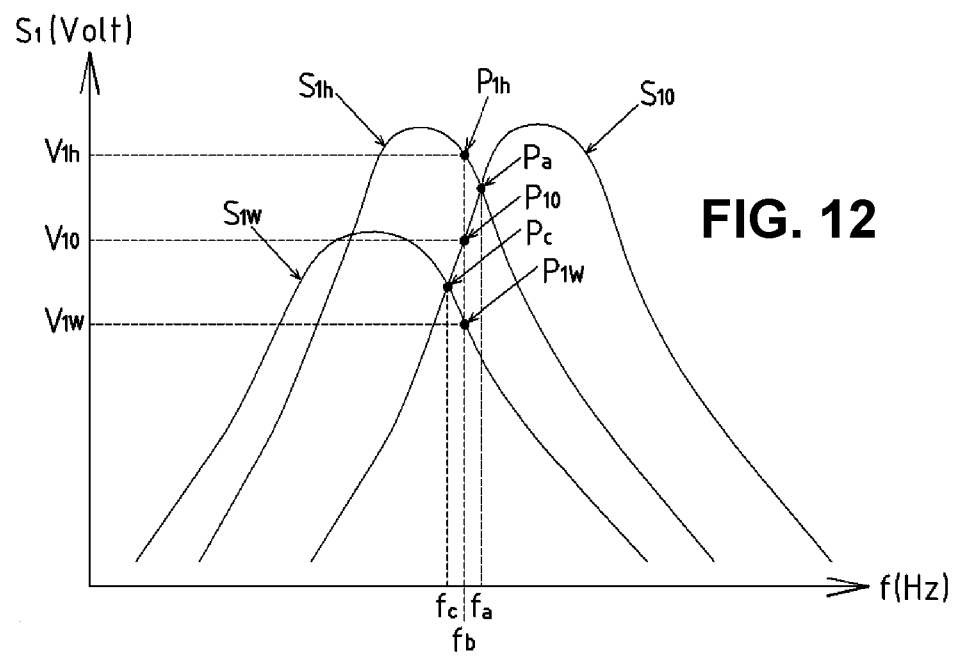
FIG. 12 is a graph showing the relationship between the frequency f of the high-frequency signal $S_0$ and the voltage signal $S_1$ when no object is in the proximity of the sensor electrode, when a human body is in the proximity of the sensor electrode, and when water is in the proximity of the sensor electrode.

Here, if the frequency at the point $P_a$ where the graph of the voltage signal $S_{10}$ and the graph of the voltage signal $S_{1h}$ intersect is $f_a$, and the frequency of the point $P_c$ where the graph of the voltage signal $S_{10}$ and the graph of the voltage signal $S_{1W}$ intersect is $f_c$, as shown in FIG. 12, by performing control so that the frequency $f_b$ of the high-frequency signal $S_0$ satisfies the relationship $$f_c < f_b < f_a$$

a human body and water can be distinguished.

That is to say, by setting the frequency $f_b$ of the high-frequency signal $S_0$ that is input to the LCR resonance circuit 20 as described above, the voltage signal $V_{10}$ (voltage at point $P_{10}$) when no object is in the proximity of the sensor electrode 22, the voltage signal $V_{1h}$ (voltage at point $P_{1h}$) when a human body is in the proximity of sensor electrode 22, and the voltage signal $V_{1W}$ (voltage at point $P_{1W}$) when water is in the proximity of the sensor electrode 22 will have the relationship $$V_{1W} < V_{10} < V_{1h}.$$

That is to say, starting from a state in which no object is in the proximity of the sensor electrode 22, the voltage signal will change in completely opposite directions, in the case in which a human body is in the proximity of the sensor electrode 22, and in the case in which water is in the proximity of the sensor electrode 22, and thus it will be possible to distinguish between a human body and water.

Figure 13:
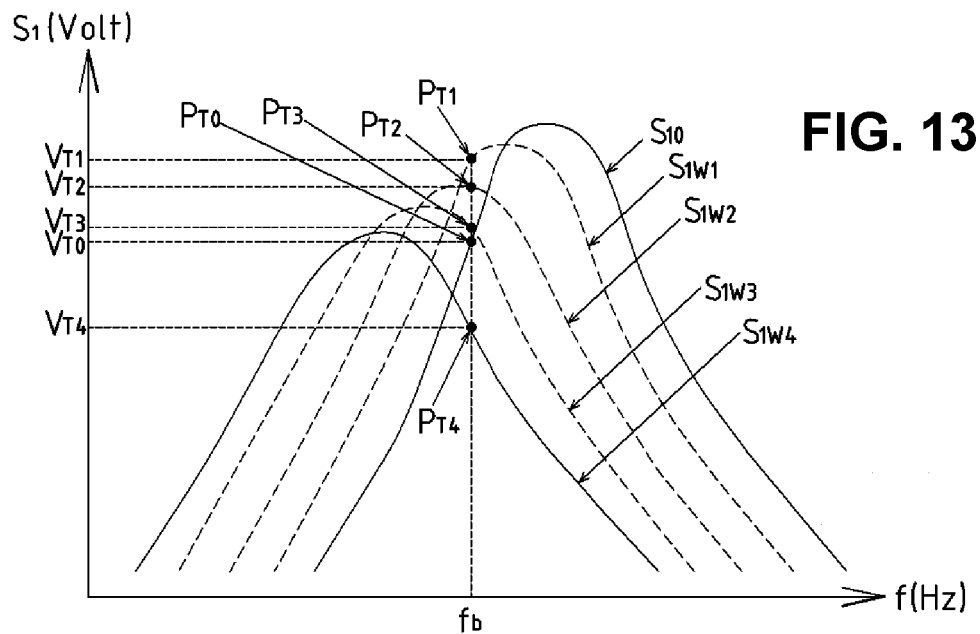
FIG. 13 is a graph showing the change over time in the frequency characteristics of the voltage signal $S_1$ when water has been sprayed on the sensor electrode starting from a state in which water is not in the proximity of the sensor electrode.

FIG. 13 shows an example of the change over time in the frequency characteristics of the voltage signal $S_1$ when water has been sprayed onto the sensor electrode 22, starting from a state in which water is not in the proximity of the sensor electrode 22.

In FIG. 13, $S_{10}$ indicates the frequency characteristics of the voltage signal when water is not in the proximity of the sensor electrode 22, $S_{1W1}$ to $S_{1W3}$ indicate the frequency characteristics of the voltage signal after the times $T_1$ to $T_3$ from the start of spraying water on the sensor electrode 22, and $S_{1W4}$ indicates the frequency characteristics of the voltage signal when the sensor electrode 22 is completely wet with water after a time $T_4$ from the start of spraying water on the sensor electrode 22.

As shown in FIG. 13, if a high-frequency signal at a frequency $f_b$ satisfying $$f_c < f_b < f_a$$

is input to the LCR resonance circuit 20, the voltage signal when water is not in the proximity of the sensor electrode 22 is $V_{T0}$ (voltage at point $P_{T0}$), and after the time $T_1$ from the start of spraying water on the sensor electrode 22 the voltage signal reaches $V_{T1}$ (voltage at point $P_{T1}$), after the time $T_2$ the voltage signal reaches $V_{T2}$ (voltage at point $P_{T2}$), after the time $T_3$ the voltage signal reaches $V_{T3}$ (voltage at point $P_{T3}$), and at the time $T_4$, when the sensor electrode 22 is completely wet with water, the voltage signal reaches $V_{T4}$ (voltage at point $P_{T4}$).

Figure 14:
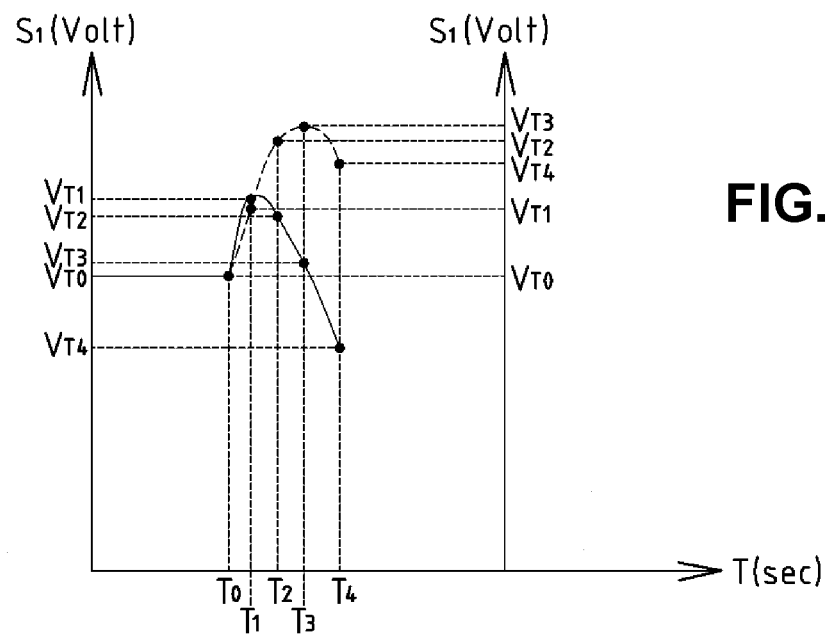
FIG. 14 is a graph showing the change over time in the voltage signal $S_1$ when water has been sprayed on the sensor electrode.

FIG. 14 shows the change over time in the voltage signal $S_1$ when water is sprayed on the sensor electrode 22, in a state in which the high-frequency signal at the frequency $f_b$ is input to the LCR resonance circuit 20. Note that, in FIG. 14, the change over time in the voltage signal when a finger has approached and touched the sensor electrode 22 is indicated by a broken line, and this is the same as the graph up to the time $T_4$ in FIG. 3 of the first exemplary mode of embodiment.

As shown in FIG. 14, when water is sprayed, the initial rate of change in the voltage signal $S_1$ is greater than the case where the finger approaches and touches, and the peak voltage and the final voltage (voltage after the time $T_4$) are lower.

Accordingly, by setting the upper-limit threshold value between the peak voltage when water has been sprayed and the peak voltage when a finger has approached and touched, a human body and water can be distinguished. Furthermore, by setting the lower-limit threshold value between the final voltage when water has been sprayed and the final voltage when a finger has approached and touched, a human body and water can be even more reliably distinguished.

Figure 15:
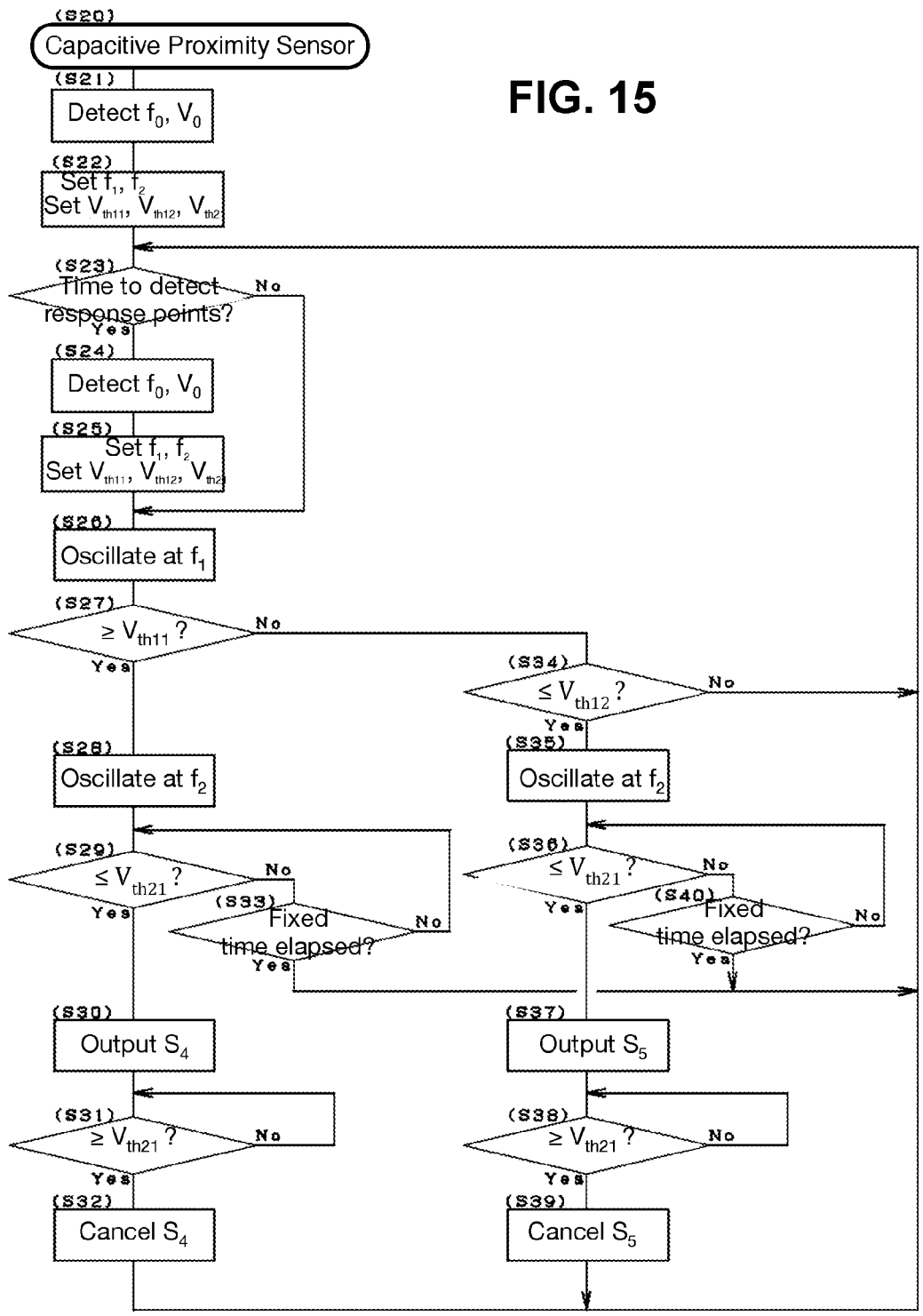
FIG. 15 is a flowchart serving to describe the detection processing performed in the proximity sensor according to a second exemplary mode of embodiment of the present invention.

Hereafter, the detection operations for a human body and water with the proximity sensor 100 of this example will be described with reference to the flowchart in FIG. 15. Note that, in FIG. 15, steps S20 to S25 are in the detection preparation mode period, which serves to set the first detection frequency $f_1$, the second detection frequency $f_2$, the upper-limit threshold value $V_{th1}$, the first lower-limit threshold value $V_{th12}$ and the second lower-limit threshold value $V_{th21}$, and steps S26 to S39 are in the detection mode period, in which the proximity of a human body or water to the sensor electrode 22 is detected.

Step S20

First, if a user carrying an electronic key approaches the vehicle, wireless communication is performed between the authentication system installed in the vehicle and the electronic key, and this is authenticated as being an authorized electronic key for the vehicle. Note that, this authentication can be performed by known authentication methods for smart entry systems.

When this is authenticated as being an authorized electronic key, the detection of a human body or water is performed by the proximity sensor 100.

Step S21

A frequency sweep of the high-frequency signal $S_0$ input to the LCR resonance circuit 20 from the high-frequency signal generating unit 43 is performed similarly to step S1 in the first exemplary mode of embodiment, whereby the resonance frequency $f_0$ and the voltage signal $V_0$ (voltage at point $P_0$) shown in FIG. 11 are detected.

Note that, in the proximity sensor 100 in this example as well, the resonance frequency $f_0$ is 261 kHz and the voltage signal $V_0$ is 2.72 V.

Step S22

Figure 16:
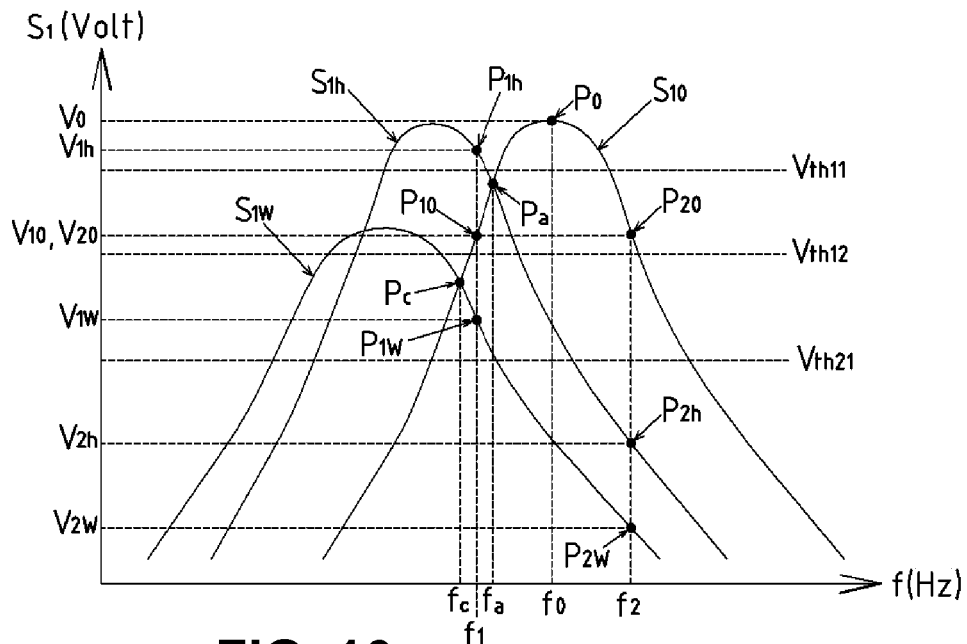
FIG. 16 is a graph serving to describe the first detection frequency $f_1$, the second detection frequency $f_2$, the upper-limit threshold value $V_{th11}$, the first lower-limit threshold value $V_{th12}$, and the second lower-limit threshold value $V_{th21}$, in the second exemplary mode of embodiment of the present invention.

Next, as shown in FIG. 16, the control unit 42 sets the first detection frequency $f_1$ that is lower than the resonance frequency $f_0$ and the second detection frequency $f_2$ that is higher than the first detection frequency $f_1$ and, based on the voltage signal $V_0$ sets the upper-limit threshold value $V_{th1}$, the first lower-limit threshold value $V_{th12}$ and the second lower-limit threshold value $V_{th21}$.

In this example, the first detection frequency $f_1$ is set to 255 kHz, which is 6 kHz lower than the resonance frequency $f_0$, and the second detection frequency $f_2$ is set to 267 kHz, which is 6 kHz higher than the resonance frequency $f_0$.

Note that, the resonance frequency $f_h$ of the LCR resonance circuit 20 when a human body is in the proximity of the sensor electrode 22 is 253 kHz, and thus the first detection frequency $f_1$ is set higher than $f_h$. Further, the frequency $f_a$ at the point $P_a$, where the graph of the voltage signal $S_{10}$ when no object is in the proximity of the sensor electrode 22 and the graph of the voltage signal $S_{1h}$ when a human body is in the proximity of the sensor electrode 22 intersect, is 259 Hz, and thus the first detection frequency $f_1$ is set to lower than $f_a$. Furthermore, the frequency $f_c$ at the point $P_c$, at which the graph of the voltage signal $S_{10}$ and the graph of the voltage signal $S_{1W}$ when water is in the proximity of the sensor electrode 22 intersect, is 254 kHz, and thus the first detection frequency $f_1$ is set higher than $f_c$.

Furthermore, in this example, the upper-limit threshold value $V_{th11}$ is set to 2.19 V. The upper-limit threshold value $V_{th11}$ is a value resulting from adding 12% of the voltage signal $V_0$ (the voltage at the point $P_0$) to the voltage signal $V_{10}$ (voltage at the point $P_{10}$) when the high-frequency signal at the first detection frequency $f_1$ is input to the LCR resonance circuit 20, in the state in which no object is in the proximity of the sensor electrode 22.

Furthermore, in this example, the first lower-limit threshold value $V_{th12}$ is set to 2.07 V. The first lower-limit threshold value $V_{th12}$ is set to a value of 76% of the voltage signal $V_0$ (voltage at point $P_0$).

Note that, when the high-frequency signal at the first detection frequency $f_1$ is input to the LCR resonance circuit 20, if the voltage signal when a human body is in the proximity of the sensor electrode 22 is $V_{1h}$ (voltage at point $P_{1h}$), and if the voltage signal when water is in the proximity of the sensor electrode 22 is $V_{1W}$ (voltage at point $P_{1W}$), the relationship $$V_{1W} < V_{th12} < V_{10} < V_{th11} < V_{1h}$$

is satisfied (see FIG. 16).

Furthermore, in this example, the second lower-limit threshold value $V_{th21}$ is set to 1.63 V. The second lower-limit threshold value $V_{th21}$ is set to a value of 60% of the voltage signal $V_0$ (voltage at point $P_0$).

Note that, when the high-frequency signal at the second detection frequency $f_2$ is input to the LCR resonance circuit 20, if a voltage signal when no object is in the proximity of the sensor electrode 22 is $V_{20}$ (voltage at point $P_{20}$), the voltage signal when a human body is in the proximity of the sensor electrode 22 is $V_{2h}$ (voltage at point $P_{2h}$), and the voltage signal when water is in the proximity of the sensor electrode 22 is $V_{2W}$ (voltage at point $P_{2W}$), the relationship $$V_{2W} < V_{2h} < V_{th21} < V_{20}$$

is satisfied (see FIG. 16).

Step S23→Step S25

In order to refresh the first detection frequency $f_1$, the second detection frequency $f_2$, the upper-limit threshold value $V_{th11}$, the first lower-limit threshold value $V_{th12}$ and the second lower-limit threshold value $V_{th21}$ at predetermined time intervals, the resonance frequency $f_0$ of the LCR resonance circuit 20 and the voltage signal $V_0$, when no object is in the proximity of the sensor electrode 22, are detected at predetermined time intervals. For this purpose, in step S23, a determination is made as to whether or not it is time to detect the resonance frequency $f_0$ and the voltage signal $V_0$ (which is to say, time to detect the resonance points).

More specifically, if one minute or more has elapsed since the previous detection, after performing the same detection and settings as in steps S21 to S22 in steps S24 to S25, we proceed to step S26. If one minute or more has not elapsed since the previous detection, we proceed directly to step S26.

Step S26

The control unit 42 performs control so as to input the high-frequency signal $S_0$ at the first detection frequency $f_1$ to the LCR resonance circuit 20 from the high-frequency signal generation unit 43.

Step S27→Step S33

Steps S27 to S33 are steps for detecting a human in the detection mode, and are the same as steps S7 to S13 of the first exemplary mode of embodiment, and thus descriptions are omitted. Note that the upper-limit threshold value $V_{th11}$ and the second lower-limit threshold value $V_{th21}$ respectively correspond to the upper-limit threshold value $V_{th1}$ and the lower-limit threshold value $V_{th2}$ in the first exemplary mode of embodiment.

If the voltage signal $S_1$ does not reach greater than or equal to the upper-limit threshold value $V_{th11}$, even when a predetermined time has elapsed since the high-frequency signal $S_0$ at the first detection frequency $f_1$ was input to the LCR resonance circuit 20 in step S27, we proceed to step S34. Note that the following steps S34 to S39 are steps for detecting water in the detection mode.

Step S34→Step S35

Figure 17:
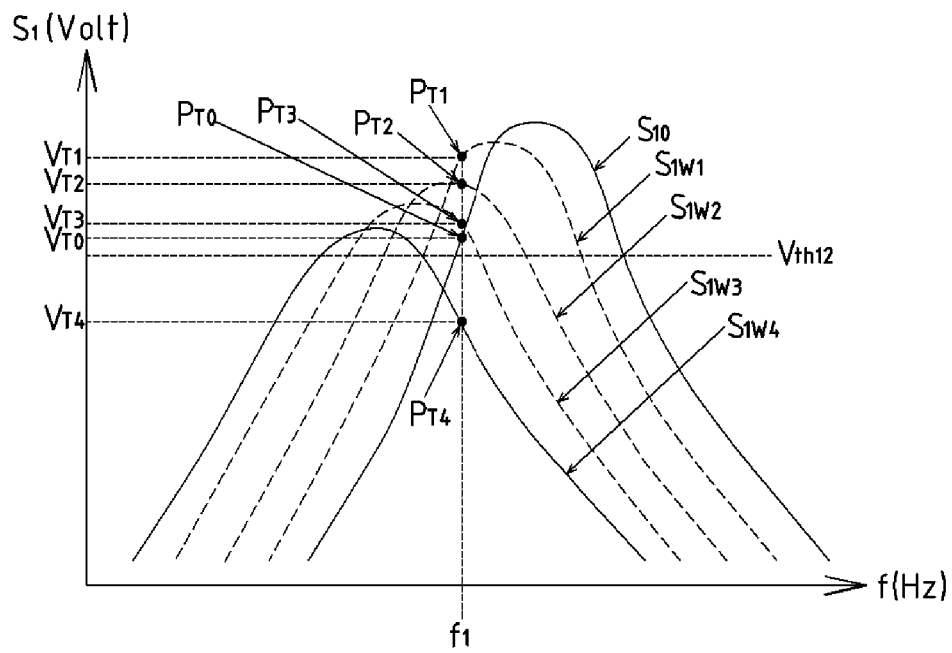
FIG. 17 is a graph showing changes in the voltage signal $S_1$ when water approaches/contacts the sensor electrode in the state in which the high-frequency signal $S_0$ at a first detection frequency $f_1$ is input, in the second exemplary mode of embodiment of the present invention.

When the high-frequency signal $S_0$ at the first detection frequency $f_1$ is input to the LCR resonance circuit 20, if water is approaching the sensor electrode 22 from time $T_0$ to $T_4$, for example, as shown in FIG. 17, the graph of the voltage signal $S_1$ also changes in the manner of $S_{10} \to S_{1W1} \to S_{1W2} \to S_{1W3} \to S_{1W4}$, and therefore the voltage signal $S_1$ changes in the manner of $V_{T0}$ (voltage at point $P_{T0}$)→$V_{T1}$ (voltage at point $P_{T1}$)→$V_{T2}$ (voltage at point $P_{T2}$)→$V_{T3}$ (voltage at point $P_{T3}$)→$V_{T4}$ (voltage at point $P_{T4}$).

In the process in which the voltage signal $S_1$ changes in the manner described above, when the voltage signal $S_1$ has reached less than or equal to the first lower-limit threshold value $V_{th12}$, it is possible that water is in the proximity of the sensor electrode 22, and thus the control unit 42 switches the high-frequency signal $S_0$ from the first detection frequency $f_1$ to the second detection frequency $f_2$.

In the case of FIG. 17, since $V_{T3} > V_{th12} > V_{T4}$, it switches from the first detection frequency $f_1$ to the second detection frequency $f_2$, between time $T_3$ and time $T_4$.

Note that, if the voltage signal $S_1$ does not reach less than or equal to the first lower-limit threshold value $V_{th12}$, even when a predetermined time has passed since the high-frequency signal $S_0$ at the first detection frequency $f_1$ was input to the LCR resonance circuit 20 in step S34, the situation is treated as the effect of transitory noise, and we return to the detection preparation mode.

Step S36, Step S37, Step S40

When the high-frequency signal $S_0$ is switched from the first detection frequency $f_1$ to the second detection frequency $f_2$, if water is approaching the sensor electrode 22 from the time T0 to $T_4$ as described above, as shown in FIG. 18, the graph for the voltage signal $S_1$ changes in the manner of $S_{10} \to S_{1W1} \to S_{1W2} \to S_{1W3} \to S_{1W4}$, and therefore the voltage signal $S_1$ changes in the manner of $V_{T0}$ (voltage at point $P_{T0}$)→$V_{T1}$ (voltage at point $P_{T1}$)→$V_{T2}$ (voltage at point $P_{T2}$)→$V_{T3}$ (voltage at point $P_{T3}$)→$V_{T4}$ (voltage at point $P_{T4}$).

Figure 18:
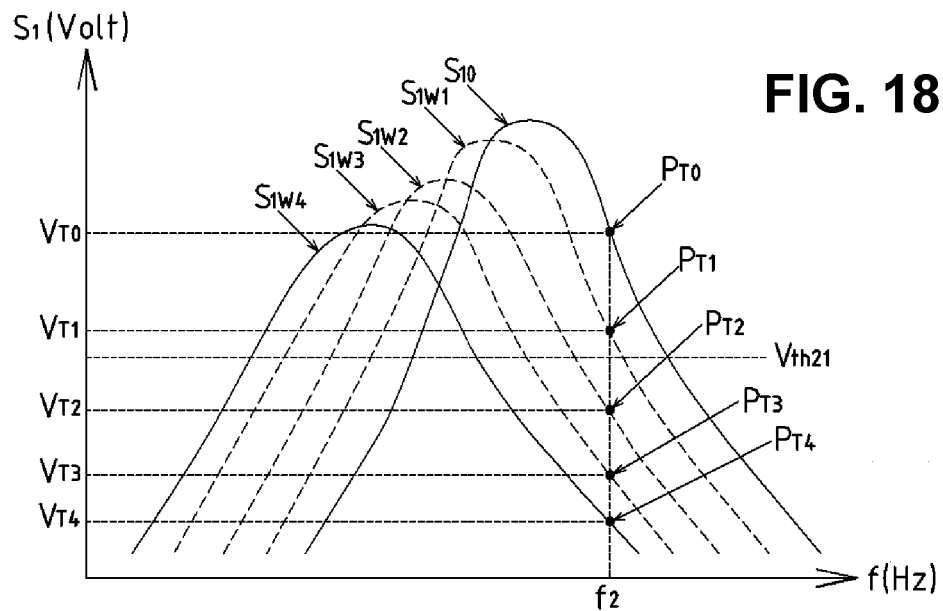
FIG. 18 is a graph showing changes in the voltage signal $S_1$ when water approaches/contacts the sensor electrode in a state in which the high-frequency signal $S_0$ at the second detection frequency $f_2$ is input, in the second exemplary mode of embodiment of the present invention.

In the case of FIG. 18, $$V_{T1} > V_{th21} > V_{T2}$$

and after the time $T_2$, the voltage signal $S_1$ reaches less than or equal to the second lower-limit threshold value $V_{th21}$. Therefore, immediately after the detection frequency is switched from the first detection frequency $f_1$ to the second detection frequency $f_2$, it is determined that water has contacted the doorhandle (water is in the proximity of the sensor electrode 22), and the water detection signal $S_5$ is output.

Note that, if the voltage signal $S_1$ does not reach less than or equal to the second lower-limit threshold value $V_{th21}$, even after a predetermined time (1 second in this example) has elapsed since switching to the second detection frequency $f_2$, the situation is treated as the effect of transitory noise, and we return to the detection preparation mode.

Step S38, Step S39

Figure 19:
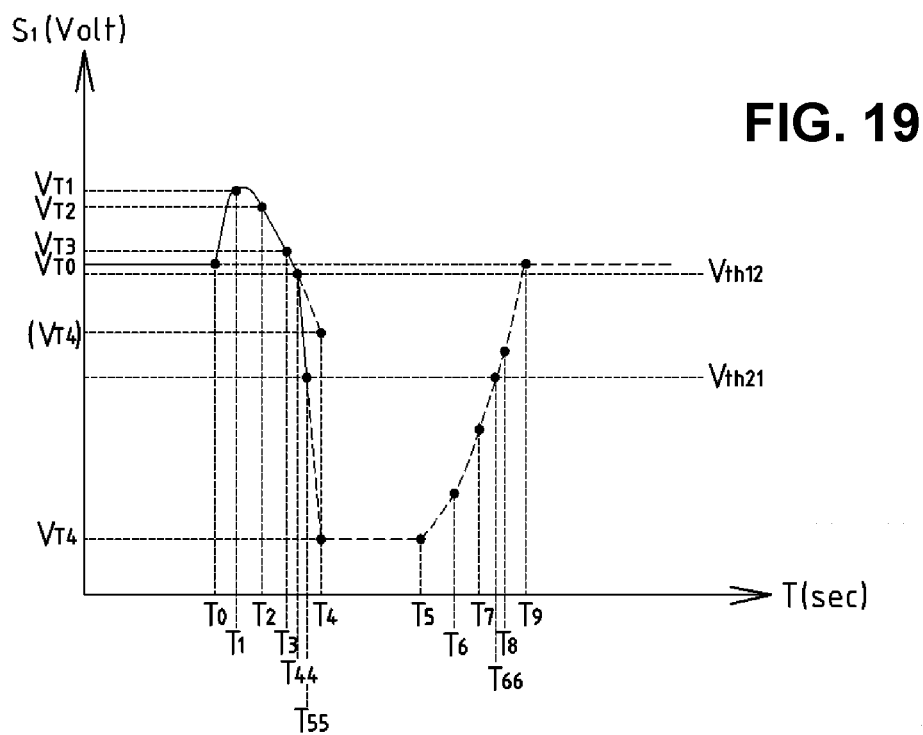
FIG. 19 is a graph showing the change over time in the voltage signal $S_1$ after spraying water on the sensor electrode up to the point in time at which water spaying is stopped, in the second exemplary mode of embodiment of the present invention.

Graphing the change over time in the voltage signal $S_1$ after spraying water on the sensor electrode 22 as described above until water spraying is stopped results in a graph such as in FIG. 19.

Based on the first detection frequency $f_1$, the voltage signal $S_1$ gradually starts to rise from the time $T_0$ and reaches a maximum value near the time $T_{11}$. Thereafter, the voltage signal $S_1$ decreases and reaches less than or equal to the first lower-limit threshold value $V_{th12}$ at the time $T_{44}$. Upon switching from the first detection frequency $f_1$ to the second detection frequency $f_2$ at the time $T_44$, the voltage signal $S_1$ reaches less than or equal to the second lower-limit threshold value $V_{th2}$ immediately thereafter, at a time T55, and the water detection signal $S_5$ is output. The voltage signal $S_1$ subsequently decreases and then substantially does not change while the sensor electrode 22 is completely wet (time $T_4$ to $T_5$), and when water spraying stops, the voltage signal $S_1$ rises in an opposite process, and is constant after a time $T_9$.

Thus, in this example, even after the water detection signal S5 is output in step S37, detection continues based on the second detection frequency $f_2$, and when it is detected that the voltage signal $S_1$ has reached greater than or equal to the second lower-limit threshold value $V_{th21}$ (time $T_{66}$), the series of detection operations are canceled, and we return to the detection preparation mode.

As described above, in the capacitive proximity sensor 100 of the present example, the resonance frequency $f_0$ of the LCR resonance circuit 20 and the voltage signal $V_0$, when no object is in the proximity of the sensor electrode 22, are detected in the detection preparation mode, the first detection frequency $f_1$ that is lower than the resonance frequency $f_0$, the second detection frequency $f_2$ that is higher than the resonance frequency $f_0$, the upper-limit threshold value $V_{th11}$, the first lower-limit threshold value $V_{th12}$ and the second lower-limit threshold value $V_{th21}$ are set.

Then, in the detection mode, in the state in which the high-frequency signal at the first detection frequency $f_1$ is input to the LCR resonance circuit 20, when it is detected that the voltage signal $S_1$ has reached greater than or equal to the upper-limit threshold value $V_{th11}$, the high-frequency signal at the second detection frequency $f_2$ is input to the LCR resonance circuit 20. Furthermore, in the state in which the high-frequency signal at the second detection frequency $f_2$ is input, the proximity of a human body to the sensor electrode 22 is detected by detecting that the voltage signal $S_1$ has reached less than or equal to the second lower-limit threshold value $V_{th21}$.

Further, in the detection mode, in the state in which the high-frequency signal at the first detection frequency $f_1$ is input to the LCR resonance circuit 20, when it is detected that the voltage signal $S_1$ has reached less than or equal to the first lower-limit threshold value $V_{th12}$, the high-frequency signal at the second detection frequency $f_2$ is input to the LCR resonance circuit 20. Furthermore, in the state in which the high-frequency signal at the second detection frequency $f_2$ is input, the proximity of water to the sensor electrode 22 is detected by detecting that the voltage signal $S_1$ has reached less than or equal to the second lower-limit threshold value $V_{th21}$.

This limits the influence of changes in the ambient temperature and variations in the characteristics of the sensor circuit components and further allows distinguishing between a human body and water without detection being performed twice with one touch.

Furthermore, in this example, the first detection frequency $f_1$ is set higher than the resonance frequency $f_h$ of the LCR resonance circuit 20 when a human body is in the proximity of the sensor electrode 22. In this case, although the risk of detection being performed twice with one touch is increased, by performing detection using the first detection frequency $f_1$ and the second detection frequency $f_2$, which are different from each other, as described above, such risks can be avoided.

Furthermore, in this example, when the high-frequency signal at the first detection frequency $f_1$ is input to the LCR resonance circuit 20, the voltage signal $V_{10}$ when no object is in the proximity of the sensor electrode 22, the voltage signal $V_{1h}$ when a human body is in the proximity of the sensor electrode 22 and the voltage signal $V1W$ when the water is in the proximity of the sensor electrode 22, satisfy the relationship $$V_{1W} < V_{th12} < V_{10} < V_{th11} < V_{1h}$$

whereby a human body and water can be reliably distinguished.

Furthermore, in this example, by setting the second detection frequency $f_2$ at greater than equal to the resonance frequency $f_0$ of the LCR resonance circuit 20 when no object is in the proximity of the sensor electrode 22, the degree of freedom with which the second lower-limit threshold value $V_{th21}$ can be set is increased, such that is possible to more reliably limit the influence of changes in ambient temperature and variations in the characteristics of sensor circuit components and thus more reliably detect the proximity of a human body or water.

Furthermore, in this example, when the high-frequency signal at the second detection frequency $f_2$ is input to the LCR resonance circuit 20, the voltage signal $V_{20}$ when no object is in the proximity of the sensor electrode 22, the voltage signal $V_{2h}$ when a human body is in the proximity of the sensor electrode 22 and the voltage signal $V_{2W}$ when water is in the proximity of the sensor electrode satisfy the relationship $$V_{2W} < V_{2h} < V_{th21} < V_{20}$$

whereby detection failure when a human body or water is in the proximity can be limited, allowing for even more reliable detection.

Third Exemplary Mode of Embodiment

Figure 20:
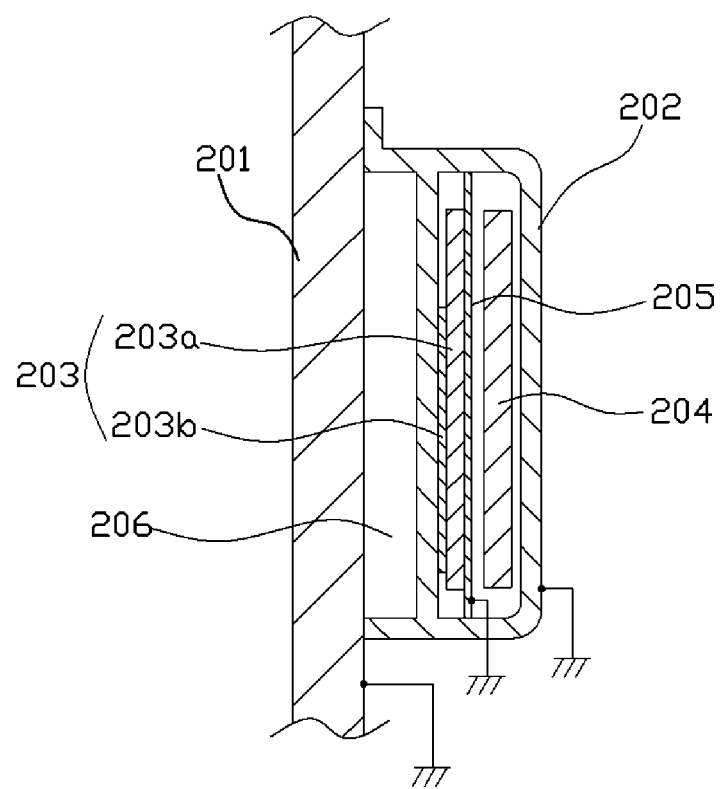
FIG. 20 is a sectional view schematically illustrating one example of a doorhandle device comprising the proximity sensor of the present invention.

FIG. 20 is a sectional view schematically illustrating a doorhandle device according to a third exemplary mode of embodiment of the present invention. The doorhandle device in this example is a doorhandle device for vehicles, and is provided with a proximity sensor for unlocking a door in a so-called smart entry system.

The doorhandle device in this example comprises a doorhandle 202, which is mounted to an outer panel 201 of a vehicle door, a proximity sensor 203, which is provided in an internal space in the doorhandle 202, and an antenna 204. The proximity sensor 203 is the same as the proximity sensor in the first or second exemplary modes of embodiment, wherein a sensor electrode 203b is mounted on a sensor board 203a, on which a sensor circuit and a microcomputer are mounted. The sensor board 203a is disposed so that the sensor electrode 203b faces the vehicle door main body side (which is to say the side of the outer panel 201). The antenna 204 serves to provide wireless communication with an electronic key carried by the user.

When a person opens the door, upon touching the doorhandle 202 by inserting a finger into a gap 206 between the outer panel 201 and the doorhandle 202, the capacitance of the sensor electrode 203b increases such that a human body or water can be detected in the same manner as in the first or second exemplary mode of embodiment, and based on this detection signal, the door locking mechanism (not shown) is controlled so as to unlock the vehicle door.

Note that, if a person grasps the doorhandle 202 strongly and the palm of the hand touches the outer surface of the doorhandle (right side surface in FIG. 20), the sensor circuit may be influenced by the capacitive coupling from the outer surface of the doorhandle, which may lead to changes in the frequency characteristics thereof or the like. For this reason, a shield electrode (shield plate) 205 is formed on the back face of the sensor board 203a, on which the sensor electrode 203b is not formed. This makes it possible to effectively suppress the influence of capacitive coupling from the outer surface of the doorhandle 202, allowing for increased accuracy in detecting human bodies or water.

Furthermore, if the doorhandle 202 is made from resin, the voltage signal may rise for a very short period of time when wetting with water begins. For this reason, it is preferable that the doorhandle 202 be made from metal, or that an electroconductive material be used for the surface thereof. This allows erroneous determinations of human bodies or water to be even more reliably prevented.

Exemplary modes of embodiment of the present invention were described above, but the present invention is not limited to these exemplary modes of embodiment, and it is a matter of course that the exemplary modes of embodiment described above can be suitably modified or the like, within a range that does not depart from the gist of the present invention.

For example, each threshold value can be set using an arbitrary calculation formula based on the aforementioned voltage signal $V_0$.

Furthermore, in the first exemplary mode of embodiment, a determination is made using the same threshold value $V_{th2}$ in step S9 and step S11, but since step S11 simply determines the timing for moving from the detection mode to the detection preparation mode, the threshold value used in step S11 can be arbitrarily set and may be different from the threshold value used in step S9.

Furthermore, in the second exemplary mode of embodiment, a determination is performed using the same threshold value $V_{th21}$ in step S29, step S31, step S36, and step S38, but these threshold values may be different from each other.

Furthermore, in the first and second exemplary modes of embodiment, the first detection frequency $f_1$ is set higher than the resonance frequency $f_h$ of the LCR resonance circuit 20 when a human body is in the proximity of the sensor electrode.

However, in the first exemplary mode of embodiment, when a high-frequency signal at the first detection frequency $f_1$ is input to the LCR resonance circuit 20, so long as the voltage signal $V_{10}$ when no object is in the proximity of the sensor electrode 22 and the voltage signal $V_{1h}$ when a human body is in the proximity of the sensor electrode 22 satisfy the relationship $$V_{10}<V_{th1}<V_{1h},$$

the first detection frequency $f_1$ can be set to be less than or equal to $f_h$.

Furthermore, in the second exemplary mode of embodiment, when a high-frequency signal at the first detection frequency $f_1$ is input to the LCR resonance circuit 20, so long as the voltage signal $V_{10}$ when no object is in the proximity of the sensor electrode 22, the voltage signal $V_{1h}$ when a human body is in the proximity of the sensor electrode 22 and the voltage signal V1W when water is in the proximity of the sensor electrode satisfy the relationship $$V_{1W}<V_{th12}<V_{10}<V_{th11}<V_{1h},$$

the first detection frequency $f_1$ can be set to be less than or equal to $f_h$.

Furthermore, in the first and second exemplary modes of embodiment, the second detection frequency $f_2$ is set higher than the resonance frequency $f_0$ of the LCR resonance circuit 20 when no object is in the proximity of the sensor electrode 22.

However, in the first exemplary mode of embodiment, when the high-frequency signal at the second detection frequency $f_2$ is input to the LCR resonance circuit 20, so long as the voltage signal $V_{20}$ when no object is in the proximity of the sensor electrode 22 and the voltage signal $V_{2h}$ when a human body is in the proximity of the sensor electrode 22 satisfy the relationship $$V_{2h}<V_{th2}<V_{20},$$

the second detection frequency $f_2$ can be set to less than or equal to $f_0$.

Furthermore, in the second exemplary mode of embodiment, when a high-frequency signal at the second detection frequency $f_2$ is input to the LCR resonance circuit 20, so long as the voltage signal $V_{20}$ when no object is in the proximity of the sensor electrode 22, the voltage signal $V_{2h}$ when a human body is in the proximity of the sensor electrode 22 and the voltage signal $V_{2W}$ when water is in the proximity of the sensor electrode 22 satisfy the relationship $$V_{2W}<V_{2h}<V_{th21}<V_{20},$$

the second detection frequency $f_2$ can be set to less than or equal to $f_0$.

Furthermore, in the exemplary mode of embodiment described above, a case in which the proximity sensor was mounted in a vehicle doorhandle was described, but the capacitive proximity sensor of the present invention can also be applied to doors in homes, offices and the like.

Furthermore, in the exemplary mode of embodiment described above, a case was described in which, when the proximity of an object has been detected, control is performed so as to lock and unlock a door but, for example, various types of interior or exterior illumination and indication lights may be controlled on and off.

What is claimed is:

1. A capacitive proximity sensor comprising:
an oscillation means, which outputs a high-frequency signal;
a sensor circuit, having an LCR resonance circuit including a sensor electrode, into which the high-frequency signal is input, and which outputs a voltage signal in accordance with the capacitance of the sensor electrode; and
a control unit, which detects the proximity of a human body to the sensor electrode, based on the voltage signal, wherein
the control unit:
in a detection preparation mode,
detects a resonance frequency $f_0$ of the LCR resonance circuit when no object is in the proximity of the sensor electrode, and detects a voltage signal $V_0$ when the high-frequency signal at the resonance frequency $f_0$ is input to the LCR resonance circuit,
sets a first detection frequency $f_1$ that is lower than the resonance frequency $f_0$ and a second detection frequency $f_2$ that is higher than the first detection frequency $f_1$ and, based on the voltage signal $V_0$, sets an upper-limit threshold value $V_{th1}$ and a lower-limit threshold value $V_{th2}$ that is lower than the upper-limit threshold value $V_{th1}$, and
in a detection mode,
detects the proximity of a human body to the sensor electrode by, in a state in which the high-frequency signal at the first detection frequency $f_1$ is input to the LCR resonance circuit, upon detecting that the voltage signal has reached greater than or equal to the upper-limit threshold value $V_{th1}$, inputting a high-frequency signal at the second detection frequency $f_2$ to the LCR resonance circuit and, in this state, detecting that the voltage signal has reached less than or equal to the lower-limit threshold value $V_{th2}$.

2. The capacitive proximity sensor according to claim 1, wherein
the first detection frequency $f_1$ is set higher than the resonance frequency of the LCR resonance circuit when a human body is in the proximity of the sensor electrode.

3. The capacitive proximity sensor according to claim 1, wherein
when the high-frequency signal at the first detection frequency $f_1$ is input to the LCR resonance circuit, if the voltage signal when no object is in the proximity of the sensor electrode is $v_{10}$, and the voltage signal when a human body is in the proximity of the sensor electrode is $v_{1h}$, the relationship $$V_{10}<V_{th1}<V_{1h}$$

is satisfied.

4. The capacitive proximity sensor according to claim 1, wherein the second detection frequency $f_2$ is set to greater than or equal to the resonance frequency $f_0$.

5. The capacitive proximity sensor according to claim 1, wherein
when the high-frequency signal at the second detection frequency $f_2$ is input to the LCR resonance circuit, if the voltage signal when no object is in the proximity of the sensor electrode is $V_{20}$, and the voltage signal when a human body is in the proximity of the sensor electrode is $V_{2h}$, the relationship $$V_{2h} < V_{th2} < V_{20}$$

is satisfied.

6. A doorhandle device comprising a doorhandle mounted to an outer panel of a vehicle door, and a capacitive proximity sensor, wherein
the doorhandle has a space at the interior thereof, and
the capacitive proximity sensor is disposed within the space; and
the capacitive proximity sensor comprises:
an oscillation means, which outputs a high-frequency signal;
a sensor circuit, having an LCR resonance circuit including a sensor electrode, into which the high-frequency signal is input, and which outputs a voltage signal in accordance with the capacitance of the sensor electrode; and
a control unit, which detects the proximity of a human body to the sensor electrode, based on the voltage signal, wherein
the control unit:
in a detection preparation mode,
detects a resonance frequency $f_0$ of the LCR resonance circuit when no object is in the proximity of the sensor electrode, and detects a voltage signal $V_0$ when the high-frequency signal at the resonance frequency $f_0$ is input to the LCR resonance circuit,
sets a first detection frequency $f_1$ that is lower than the resonance frequency $f_0$ and a second detection frequency $f_2$ that is higher than the first detection frequency $f_1$ and, based on the voltage signal $V_0$, sets an upper-limit threshold value $V_{th1}$ and a lower-limit threshold value $V_{th2}$ that is lower than the upper-limit threshold value $V_{th1}$, and
in a detection mode,
detects the proximity of a human body to the sensor electrode by, in a state in which the high-frequency signal at the first detection frequency $f_1$ is input to the LCR resonance circuit, upon detecting that the voltage signal has reached greater than or equal to the upper-limit threshold value $V_{th1}$, inputting a high-frequency signal at the second detection frequency $f_2$ to the LCR resonance circuit and, in this state, detecting that the voltage signal has reached less than or equal to the lower-limit threshold value $V_{th2}$.

7. The doorhandle device according to claim 6, wherein:
the capacitive proximity sensor is formed on a board;
the board is disposed so that the sensor electrode faces the outer panel side; and
a shield electrode is formed on the back face of the board on which the sensor electrode is not formed.

8. The doorhandle device according to claim 7, wherein:
the surface of the doorhandle is electroconductive.

9. A capacitive proximity sensor comprising:
an oscillation means, which outputs a high-frequency signal;
a sensor circuit, having an LCR resonance circuit including a sensor electrode, into which the high-frequency signal is input, and which outputs a voltage signal in accordance with the capacitance of the sensor electrode; and
a control unit, which detects the proximity of a human body to the sensor electrode, based on the voltage signal, wherein
the control unit:
in a detection preparation mode,
detects a resonance frequency $f_0$ of the LCR resonance circuit when no object is in the proximity of the sensor electrode, and detects a voltage signal $V_0$ when the high-frequency signal at the resonance frequency $f_0$ is input to the LCR resonance circuit,
sets a first detection frequency $f_1$ that is lower than the resonance frequency $f_0$ and a second detection frequency $f_2$ that is higher than the first detection frequency $f_1$ and, based on the voltage signal $V_0$, sets an upper-limit threshold value $V_{th11}$, a first lower-limit threshold value $V_{th12}$ that is lower than the upper-limit threshold value $V_{th11}$, and a second lower-limit threshold value $V_{th21}$, and
in a detection mode,
detects the proximity of a human body to the sensor electrode by, in a state in which the high-frequency signal at the first detection frequency $f_1$ is input to the LCR resonance circuit, upon detecting that the voltage signal has reached greater than or equal to the upper-limit threshold value $V_{th11}$, inputting a high-frequency signal at the second detection frequency $f_2$ to the LCR resonance circuit and, in this state, detecting that the voltage signal has reached less than or equal to the second lower-limit threshold value $V_{th21}$, and
detects the proximity of water to the sensor electrode by, in a state in which the high-frequency signal at the first detection frequency $f_1$ is input to the LCR resonance circuit, upon detecting that the voltage signal has reached less than or equal to the first lower-limit threshold value $V_{th12}$, inputting a high-frequency signal at the second detection frequency $f_2$ to the LCR resonance circuit and, in this state, detecting that the voltage signal has reached less than or equal to the second lower-limit threshold value $V_{th21}$.

10. The capacitive proximity sensor according to claim 9, wherein
the first detection frequency $f_1$ is set higher than the resonance frequency of the LCR resonance circuit when a human body is in the proximity of the sensor electrode.

11. The capacitive proximity sensor according to claim 9, wherein
when the high-frequency signal at the first detection frequency $f_1$ is input to the LCR resonance circuit, if the voltage signal when no object is in the proximity of the sensor electrode is $V_{10}$, the voltage signal when a human body is in the proximity of the sensor electrode is $V_{1h}$ and the voltage signal when water is in the proximity of the sensor electrode is $V_{1W}$, the relationship $$V_{1W} < V_{th12} < V_{10} < V_{th11} < V_{1h}$$

is satisfied.

12. The capacitive proximity sensor according to claim 9, wherein the second detection frequency $f_2$ is set to greater than or equal to the resonance frequency $f_0$.

13. The capacitive proximity sensor according to claim 9, wherein when the high-frequency signal at the second detection frequency $f_2$ is input to the LCR resonance circuit, if the voltage signal when no object is in the proximity of the sensor electrode is $V_{20}$, the voltage signal when a human body is in the proximity of the sensor electrode is $V_{2h}$ and the voltage signal when water is in the proximity of the sensor electrode is $V_{2W}$, the relationship $$V_{2W} < V_{2h} < V_{th21} < V_{20}$$

is satisfied.

14. A doorhandle device comprising a doorhandle mounted to an outer panel of a vehicle door, and a capacitive proximity sensor, wherein the doorhandle has a space at the interior thereof, and
the capacitive proximity sensor is disposed within the space; and
the capacitive proximity sensor comprises:
an oscillation means, which outputs a high-frequency signal;
a sensor circuit, having an LCR resonance circuit including a sensor electrode, into which the high-frequency signal is input, and which outputs a voltage signal in accordance with the capacitance of the sensor electrode; and
a control unit, which detects the proximity of a human body to the sensor electrode, based on the voltage signal, wherein
the control unit:
in a detection preparation mode,
detects a resonance frequency $f_0$ of the LCR resonance circuit when no object is in the proximity of the sensor electrode, and detects a voltage signal $V_0$ when the high-frequency signal at the resonance frequency $f_0$ is input to the LCR resonance circuit,
sets a first detection frequency $f_1$ that is lower than the resonance frequency $f_0$ and a second detection frequency $f_2$ that is higher than the first detection frequency $f_1$ and, based on the voltage signal $V_0$, sets an upper-limit threshold value $V_{th11}$, a first lower-limit threshold value $V_{th12}$ that is lower than the upper-limit threshold value $V_{th11}$, and a second lower-limit threshold value $V_{th21}$, and
in a detection mode,
detects the proximity of a human body to the sensor electrode by, in a state in which the high-frequency signal at the first detection frequency $f_1$ is input to the LCR resonance circuit, upon detecting that the voltage signal has reached greater than or equal to the upper-limit threshold value $V_{th11}$, inputting a high-frequency signal at the second detection frequency $f_2$ to the LCR resonance circuit and, in this state, detecting that the voltage signal has reached less than or equal to the second lower-limit threshold value $V_{th21}$, and
detects the proximity of water to the sensor electrode by, in a state in which the high-frequency signal at the first detection frequency $f_1$ is input to the LCR resonance circuit, upon detecting that the voltage signal has reached less than or equal to the first lower-limit threshold value $V_{th12}$, inputting a high-frequency signal at the second detection frequency $f_2$ to the LCR resonance circuit and, in this state, detecting that the voltage signal has reached less than or equal to the second lower-limit threshold value $V_{th21}$.

15. The doorhandle device according to claim 14, wherein:

the capacitive proximity sensor is formed on a board;
the board is disposed so that the sensor electrode faces the vehicle door main body side, and
a shield electrode is formed on the back face of the board on which the sensor electrode is not formed.

16. The doorhandle device according to claim 15, wherein:

the surface of the doorhandle is electroconductive.

* * * * *